(12) United States Patent
Higashikawa

(10) Patent No.: US 6,951,689 B1
(45) Date of Patent: Oct. 4, 2005

(54) SUBSTRATE WITH TRANSPARENT CONDUCTIVE LAYER, AND PHOTOVOLTAIC ELEMENT

(75) Inventor: Makoto Higashikawa, Kyotanabe (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/233,033

(22) Filed: Jan. 20, 1999

(30) Foreign Application Priority Data

Jan. 21, 1998 (JP) ................................ 10-009193

(51) Int. Cl.$^7$ .............................................. B32B 9/04
(52) U.S. Cl. ....................... 428/699; 428/698; 428/699; 428/704
(58) Field of Search ............................... 428/446, 698, 428/699, 704

(56) References Cited

U.S. PATENT DOCUMENTS 5,456,762 A * 10/1995 Kariya et al. ............... 136/258

FOREIGN PATENT DOCUMENTS

| JP | 59-43101 | 10/1984 |
| JP | 60-84888 | 5/1985 |
| JP | 60-41878 | 9/1985 |

OTHER PUBLICATIONS

H. Deckman, et al., *Sixteenth IEEE Photovoltaic Specialists Conference—1982*, "Optical Enhancement of a-SiH$_x$ Solar Cells", 82CH1821-8, ISSN: 0160-8371, pp 1425-1426.
T. Tiedje, et al., *Sixteenth IEEE Photovoltaic Specialists Conference—1982*, "Enhanced Optical Absorption Produced by Light Trapping in Amorphous Silicon Films", 82CH1821-8, ISSN: 0160-8371, pp 1423-1426.
Yoshihiro Hamakawa, et al., *Applied Physics Letters*, "New types of high efficiency solar cells based on a- Si", vol. 43, No. 7, (1983) pp. 644-646.

* cited by examiner

Primary Examiner—Deborah Jones
Assistant Examiner—Lymarie Miranda

(57) ABSTRACT

The present invention provides a substrate with a transparent conductive layer comprising at least one layer stacked on a supporting substrate, wherein the surface of the transparent conductive layer has a distribution of inclination arctan (df/dx) in the range of sampling length dx between 20 nm and 100 nm when a distance of the surface of said transparent conductive layer from the surface of said supporting substrate is regarded as f being a normal distribution having a kurtosis of −1.2 to 0.5 around 0° and a standard deviation of 20° to 55°, and a photovoltaic element using the substrate. The substrate can be produced at a high yield and a low cost suitable for practical use and has a high reliability. In addition, a photovoltaic element having a high photoelectric conversion efficiency is obtained when the substrate is used in manufacturing it.

12 Claims, 7 Drawing Sheets

SUBSTRATE WITH TRANSPARENT CONDUCTIVE LAYER, AND PHOTOVOLTAIC ELEMENT

BACKGROUND OF THE INVENTION

1. Field of the Invention

The present invention relates to a substrate with transparent conductive layer(s), more particularly a substrate for a photovoltaic element with transparent conductive layer(s) capable of improving the yield in the production process and reliability such as weatherability or durability while improving the efficiency of photoelectric conversion by use of light confinement effect, and a photovoltaic element using the same. The photovoltaic element is one used for solar cells, photodiodes, electrophotographic photosensitive materials or the like.

2. Related Background Art

A photovoltaic element for converting light into electric energy has been widely applied to a small power source for public appliances, such as electronic calculators or wrist watches, as a solar cell and attracts attention as a technique practicable for future substitutes to so-called fossil fuels such as petroleum and coal. It is also used for facsimile, scanner or the like as a sensor and also for an electrophotographic photosensitive drum in copiers or the like. The photovoltaic element utilizes the photoelectromotive force of a semiconductor p-n junction or photoelectric conversion of a semiconductor, in which light is absorbed into a semiconductor such as silicon to generate photocarriers of electrons and electron holes to drift and remove them by the internal electric field of a p-n junction remove.

Photovoltaic elements that have been thus far used most generally are those constructed with single-crystalline silicon. Such a photovoltaic element can be manufactured by a process similar to a normal semiconductor process. Specifically, a single crystal of silicon subjected to valence electron control into n-type or p-type is prepared by a crystal growth method such as a CZ method, and the single crystal is sliced to make silicon wafers about 300 $\mu$m in thickness. Furthermore, a p-n junction is made up by forming a different-type conductive layer on the surface of a wafer under application of a valence electron control agent by appropriate means such as diffusion so as to form a layer of a conductivity type opposite to that of the above wafer.

The production cost for a photovoltaic element using such single-crystalline silicon, however, is increased. Because of a high cost in making silicon wafers and a high manufacturing cost due to the use of a semiconductor process, the photovoltaic element becomes rather expensive for the amount of unit electricity generated compared to an existing power generating method. It is considered difficult to lower the production cost to a level for power generation.

Thus, in advancement into a practical use for the power source of a photovoltaic element, cost reduction and area increasing are recognized to be important technical problems, and materials that are low in cost or high in conversion efficiency have been searched.

As a material for such photovoltaic elements, a tetrahedral amorphous semiconductor such as amorphous silicon, amorphous silicon germanium, and amorphous silicon carbide, or a polycrystalline semiconductor, or a semiconductor of the groups II–VI compounds such as CdS or $Cu_2S$ or a semiconductor of the groups III–V compounds such as GaAs or GaAlAs can be referred. Above all, a thin-film photovoltaic element using an amorphous semiconductor or a polycrystalline semiconductor as a photoelectromotive force generating layer is advantageous in that it enables preparation of a larger area film than a photovoltaic element using single-crystalline silicon. A film can be thin, and a film layer can be deposited onto any supporting substrate material and regarded as promising.

In the above photovoltaic element, however, photoelectric conversion efficiency comparable to that of a photovoltaic element using single-crystalline silicon has not yet been obtained. Improving the photoelectric conversion efficiency and improving the reliability have been a problem to be studied to make this element practicable as a power element.

Thus, various methods have been examined as means for improving the photoelectric conversion efficiency of a film photovoltaic element.

One of the important problems in improving the photoelectric conversion efficiency of a film photovoltaic element is to increase the light absorption in a film semiconductor layer and to increase the short-circuit current (Jsc). This is because making the semiconductor layer thinner for cost lowering leads to a smaller optical absorption than that of a bulk semiconductor. Several techniques have been examined for increasing the light absorption in a film semiconductor layer.

As one of them, a technique for growing a reflective layer, also serving as a back face electrode, made of a metal film with a high reflectivity such as Ag, Al, Cu or Au, is known. This technique intends to reflect the light transmitted through the semiconductor layer generating carriers reflected by the reflective layer so as to be absorbed by the semiconductor layer again, thereby increasing the light absorption in a film semiconductor layer, and increasing the output current to improve the photoelectric conversion efficiency.

On the other hand, a method for improving the substrate surface property by laying a transparent conductive film between the back face electrode and the semiconductor layer is disclosed in Japanese Patent Publication No. 59-43101 and Japanese Patent Publication No. 60-41878. As the effect of laying a transparent conductive film between the back face electrode and the semiconductor layer, improving the evenness property of a back face electrode, improving the close adhesion of a semiconductor layer, or preventing the alloying between the metal of a back face electrode and a semiconductor layer or the like is referred to in these Patent Publications.

Besides, Japanese Patent Application Laid-Open No. 60-84888 discloses a technique for reducing the current flowing through the defect region of a semiconductor layer by laying a transparent conductive film between the back face electrode and the semiconductor layer as the barrier layer.

Besides, it is reported at p. 644 of Appl. Phys. Lett., 43 (1983) by Y. Hamakawa et al. that the spectral sensitivity of a long-wavelength region is increased by laying a transparent conductive film made of $TiO_2$ between the Ag back face electrode and the amorphous silicon semiconductor layer.

Besides, disclosed at p. 1423 of Proc. 16th IEEE Photovoltaic Specialist Conf. (1982) by T. Tiedje et al and p. 1425 of Proc. 16th IEEE Photovoltaic Specialist Conf. (1982) by H. Deckman et al. is a technique for allowing the long-wavelength light not absorbed into a semiconductor to be scattered on a back face electrode, the which is formed into an uneven shape (texture structure) having a size of about the light wavelength, thereby increasing the optical path length in the semiconductor layer and improving the long-wavelength sensitivity of a photovoltaic element to increase the short-circuit current and improve the photoelectric conversion efficiency.

On summarizing these techniques, a constitution is considered to be the most suitable for a photovoltaic element wherein a metal layer having an uneven shape and about a light wavelength size for scattering light and a high reflectivity is formed as a back face reflective layer serving simultaneously as a back face electrode and a transparent conductive film is interposed between the back face reflective layer and a semiconductor layer.

When an attempt is made to actually manufacture a photovoltaic element by adopting a back face electrode of such a constitution, several problems appeared from the viewpoint of workability or durability.

Thus far, a typical uneven form referred to as a so-called texture structure, e.g., the one having a pyramid-shaped unevenness as illustrated in the above literature of T. Tiedje et al., has been considered to be excellent in confinement effect. However, there is the need for further examining which shape is the most suitable for improving the efficiency and yield and for improving the operativity in the subsequent steps.

First of all, in a semiconductor layer of a pyramid-shaped unevenness having steep vertexes or valleys formed on the surface, a stress is generated locally at the vertex of a pyramid shape and a defect portion is likely to be created in the semiconductor layer. Besides, when an electromotive force is generated, the leakage current of a photovoltaic element through the defect portion or the like of the semiconductor layer may increase by the concentration of the electric field at the vertex of the pyramid shape, thereby lowering the manufacturing yield of the photovoltaic element.

Especially, in the case of depositing the semiconductor layer at high speed, e.g., at a deposition speed of 10 Å/s or more, the adherence of a film is liable to become uniform, so that a fault in the deposition of a film at the valley between pyramid shapes or a peeling of the film from the vertexs may be observed.

Besides, in a semiconductor layer formed on the uneven surface of pyramid shapes having uniformly steep vertexes or valleys, the electric field became more intense at the pyramid vertexes than in the semiconductor layer formed on a flat surface, so that there were cases where a nonuniform electric field led to a decrease in the open voltage (Voc) and the fill factor (FF) of a photovoltaic element as compared with a photovoltaic element formed on a flat supporting-substrate surface.

Furthermore, an increase in the optical degradation (worsening of element characteristics due to long-time light illumination) and the vibrational degradation (worsening of element characteristics due to long-time application of vibration) of a photovoltaic element may be observed. Namely, the optical degradation of a photovoltaic element is considered to be generated by breaking weak bonds by light energy to form recombination centers of photoexcited carriers, thereby worsening the element characteristics. Also, the vibrational degradation of a photovoltaic element is considered to be generated by breaking weak bonds by vibration energy to form recombination centers of photoexcited carrier, thereby lowering the element characteristics. These weak bonds are considered to be localized in a region where a stress is generated.

When a semiconductor layer is deposited at a high speed, pin holes are especially likely to be generated, whereas a short circuit may occur in the semiconductor layer when the transparent conductive layer with a high conductivity is used.

Besides, in the case of using Ag or Cu as the back face metal reflective layer, a migration of Ag or Cu was found to occur at high humidity and under application of a positive vias voltage to the back face metal reflective layer, so that a conduction took place between the reflective layer and the electrode on the light incident side and the photovoltaic element shunted (was short-circuited).

On the other hand, when a transparent conductive layer is formed in a flat shape, there were problems of an insufficient light absorption in the semiconductor layer because of a small scattering of light on the back face, and at peeling that might occur between the supporting substrate and the back face electrode in the working step of a photovoltaic element because some combination of materials for the supporting substrate and the back face electrode led to an insufficient adhesion between the supporting substrate and the back face electrode.

In the step of removing the electrically short circuit in a faulty portion as the subsequent step, a reaction may proceed excessively at the steep vertex of a pyramid shape on a surface having a pointed unevenness, thereby damaging a place where there is no defect. Consequently, in such a substrate, the setting range of conditions in the step of removing the electrically short circuit in defect portion is compelled to be narrowed. This requires a strict control over the removing step, thereby lowering productivity.

In the step of removing the short circuit in a faulty portion as the subsequent step, a lower corrosion resistance of transparent conductive film may cause the transparent conductive layer to be etched through pin holes, or lead to film peeling or induction of a short circuit by contraries, thereby lowering reliability.

These problems were conspicuous especially in the case of adopting a cost-saving manufacturing step suitable for a practical implementation by using an inexpensive supporting substrate such as resin film or stainless film or by increasing the production speed as a result of an increase in the formation speed of a semiconductor layer, and are a factor in lowering the yield of manufacturing a photovoltaic element.

SUMMARY OF THE INVENTION

It is an object of the present invention to solve problems of workability, yield or durability as mentioned above and moreover to increase the light absorption in the semiconductor layer and also provide a photovoltaic element with high reliability and photoelectric conversion efficiency and a substrate for photovoltaic element which can be produced at a high yield and a low cost suitable for practical use.

As a result of studying the above problems, the present inventor found the above problems solvable by forming a transparent conductive layer having a specific distribution of inclination arctan (df/dx) in the range of sampling length dx between 20 nm and 100 nm when a distance from a supporting substrate face and thereby has accomplished the present invention. Here, the supporting substrate face means a virtual plane obtained by removing unevenness from an actual supporting substrate, and it does not mean an actual supporting substrate surface (which may have unevenness).

Namely, the present invention provides a substrate with a transparent conductive layer comprising at least one layer stacked thereon, characterized in that the surface of the transparent conductive layer has a distribution of inclinations arctan (df/dx) in the range of a sampling length of 20 nm to 100 nm when a distance of the surface of the transparent conductive layer from the supporting substrate face is regarded as f being a normal distribution having a kurtosis of −1.2 to 0.5 around 0° and a standard deviation thereof being 20° to 55°.

DESCRIPTION OF THE PREFERRED EMBODIMENTS

Figure 1A:
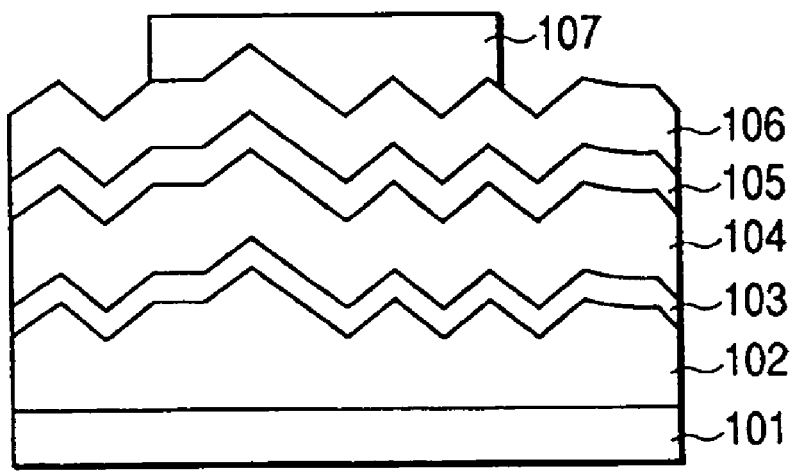
FIGS. 1A and 1B are schematic sectional views each showing one example of photovoltaic element according to the present invention.
Figure 1B:
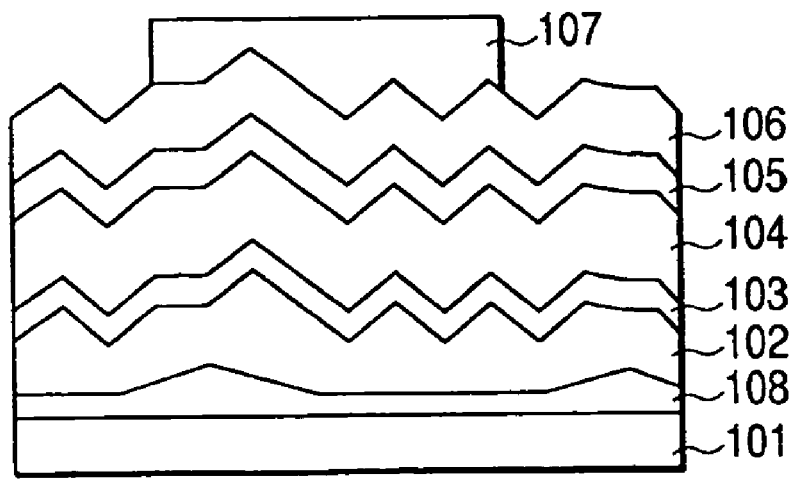

One example of a photovoltaic element using a substrate with a transparent conductive layer according to the present invention is shown in FIGS. 1A and 1B. FIGS. 1A and 1B are schematic sectional views each showing one example of a photovoltaic element according to the present invention. In FIG. 1A, numeral 1 denotes a supporting substrate, on which a transparent layer 102, an n-type semiconductor layer 103, an i-type semiconductor layer 104, a p-type semiconductor layer 105, a transparent electrode 106 and a collector electrode 107 are stacked. As shown in FIG. 1B, a metal layer 108 may be provided between the supporting substrate 101 and the transparent conductive layer 102. This is one example but the present invention is not limited to this construction.

First, individual layers constituting a substrate with a transparent conductive layer and a photovoltaic element according to the present invention will be described in detail.

(Transparent Conductive Layer 102)

For a photovoltaic element with light incident on semiconductor layers 103–105 from the side of a supporting substrate 101, the transparent conductive layer 102 is disposed on the surface of the semiconductor layers 103–105 at the light incident direction side, and simultaneously plays a role of transmitting the incident light therethrough and randomly reflecting the incident light at an interface thereof to cause an incidence of light on the semiconductor layers 103–105 and a role of a surface electrode in the photovoltaic element. For a photovoltaic element with light incident from the side of the transparent electrode 106 reversely, the transparent conductive layer plays the roles of a light confinement layer and a reflection enhancing layer.

The material quality of a transparent conductive layer preferably is high in transmittance, moderate in conductivity, and inexpensive. Conductive oxides, such as $In_2O_3$, $SnO_2$, ITO ($In_2O_3+SnO_2$), ZnO, CdO, $Cd_2SnO_4$, $TiO_2$, $Ta_2O_5$, $Bi_2O_3$, $MoO_3$ and $NaxWO_3$, or their mixtures or these compounds added with a dopant can be used.

Above all of them, the transparent conductive layer is made preferably of an oxide or nitride of aluminum, zinc, tin, indium, titanium or tantalum, or a complex compound thereof.

The conductivity of a transparent conductive layer is preferably $10^{-8}$ (1/Ωcm) to $10^{-2}$ (1/Ωcm) and more preferably $10^{-7}$ (1/Ωcm) to $10^{-3}$ (1/Ωcm). When pin holes are generated in the semiconductor layers 103–105 to cause a short circuit, it is considered possible to reduce the worsening of characteristics because a moderate conductivity of the transparent conductive layer 102 maintains enough electric resistance to prevent a deterioration in characteristics.

To the transparent conductive layer is preferably added corrosion resistance enhancing materials, i.e., impurities for increasing the corrosion resistance. Addition of corrosion resistance enhancing materials enables to set a range of conditions in the step of removing a short circuit in a defect portion as the subsequent step to be widely chosen, and to perform restoration to a degree. In removing defects, melting of the transparent conductive layer and further spread or creation of a defect is prevented.

Such additives differ depending on materials of a transparent conductive layer, but for example, copper or chromium is used for zinc oxide, and aluminum is preferably used for tin oxide.

Methods for forming a transparent conductive layer differ depending on its materials, but the following methods can be applied.

A method for forming a transparent conductive layer includes various CVD methods such as microwave plasma CVD, RF plasma CVD, optical CVD, thermal CVD and MOCVD, or various evaporation methods such as EB evaporation, sputtering evaporation, MBE, ion plating and ion beam evaporation, or metal plating process, printing process or the like.

Hereinafter, as one example, a procedure for forming a transparent conductive layer made of ZnO by the sputtering process will be described, but the present invention is not limited to this example.

In depositing a transparent conductive layer, Xe, $O_2$ and $F_2$ are used. By adjusting the addition amount of $F_2$, a surface form is can be easily controlled. The amount of addition is preferably 1% to 10%. For 10% or less of the addition amount of $F_2$, there is no increase in inclination due to the competition of deposition inhibition effect, and for 1% or more no powdery film is formed; both cases are preferable.

Besides, the forming temperature is also an important factor and preferably ranges from about 200° C. to 300° C., in which no increase in inclination is observed. The deposition speed should better be relatively high and preferably ranges from 10 Å/s to 100 Å/s. The deposition pressure depends on the type of a gas and a deposition apparatus, but should better be relatively low and preferably range from 1 mTorr to 10 mTorr.

Alternatively, etching with an acid or alkali is also effective. Formic acid, acetic acid, sulfuric acid, hydrochloric acid, nitric acid as examples of acids and potassium hydroxide, sodium hydroxide and aluminum hydroxide as examples of alkalis and ferric chloride, aluminum chloride and aluminum sulfate as examples of salts can be used. The time of immersion in an etchant is a very important factor and controllable in a relatively stable manner for a liquid mixture of acetic acid and aluminum sulfide as etchant. Besides, the temperature is a very important control parameter which depends on the concentration of an etchant, but the temperature should be lower for better controllability.

The transparent conductive layer in the present invention has the distribution of inclination arctan (df/dx) in a sample length dx when a distance of the surface of the transparent conductive layer from the supporting substrate face which is a normal distribution having a kurtosis of −1.2 to 0.5 around 0°, and a standard deviation thereof 20° to 55°. Incidentally, here, the supporting substrate face means a virtual plane obtained by removing unevenness from an actual supporting substrate surface, and it does not mean an actual supporting substrate surface (which may have the unevenness).

Figure 2A:
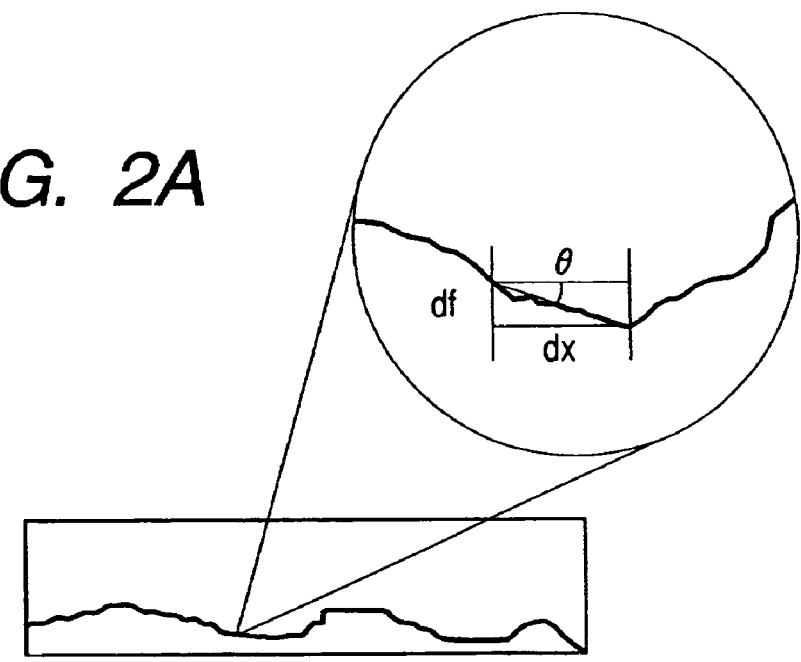
FIG. 2A is a conceptual view showing an inclination of the surface form of a transparent conductive layer and FIG. 2B is a conceptual view showing a local valley and a local mountain.

FIG. 2A is a conceptual view showing the surface shape of a transparent conductive layer. The surface of a transparent conductive layer is observed, e.g., by using a probe microscope and the distribution of inclinations can be evaluated by determining the inclination arctan (df/dx) from the gradient of df/dx of a surface for any sampling length dx.

The distribution of inclinations is preferably a normal distribution around 0° without any deviation to a certain angle.

Besides, the kurtosis representing a deviation from the normal distribution is represented by the following equation. A plus or minus kurtosis shows that the distribution forms a relatively sharp angle or is flat, respectively.

$$\left\{\frac{n(n+1)}{(n-1)(n-2)(n-3)}\Sigma\left(\frac{(x_1-\overline{x})}{s}\right)\right\} - \frac{3(n-1)^2}{(n-2)(n-3)}$$

(s: standard deviation)

The kurtosis ranges from −1.2 to 0.5, preferably from −1.0 to 0.3 and more preferably from −0.7 to 0.2. Since these ranges generate an optical path length passing through the semiconductor layers 103–105, and exhibit a cancellation effect of interference, these kurtosis ranges are preferable.

The standard deviation in the distribution of inclinations ranges from 20° to 55°, preferably from 25° to 50° and more preferably from 30° to 45°.

When the standard deviation is within this range, the optical path length passing through the semiconductor layers 103–105 extends, and the light passing through the transparent conductive layer 102 and reflected from the supporting substrate 101 or the metal layer 108 is partly reflected multiple times, thereby canceling the interference in the transparent conductive layer 102 and further eliminating problems of a defect generated in the semiconductor layers 103–105 or of a film that is too thin, leading to ineffectiveness and an increase in a short-circuit photocurrent, so that the above ranges are preferable.

Figure 2B:
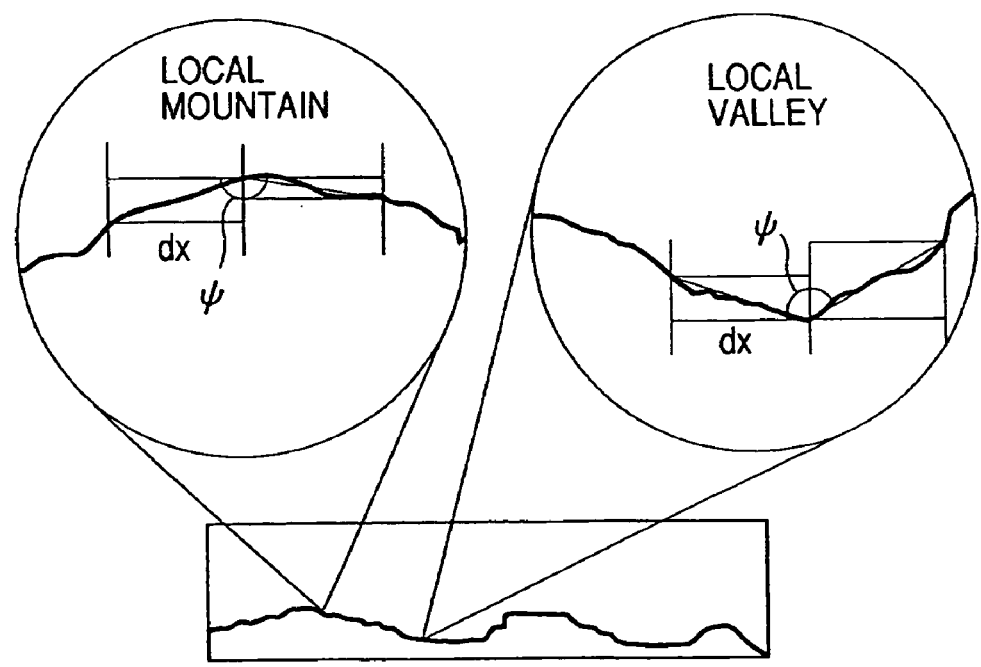

Besides, conceptual views of a local mountain and a local valley in the surface shape of a transparent conductive layer are shown in FIG. 2B, but the mean value of angles (ψ in the drawing) made by local valleys in the sectional shape of the surface of the transparent conductive layer ranges preferably from 170° to 110°, more preferably from 160° to 120° and still more preferably from 150° to 130°. When the mean value is within these ranges, a semiconductor layer does not have a defect generated by hardly depositing the semiconductor layer on the transparent conductive layer to make the semiconductor layer thinner, so that these ranges are preferable. Deposition speed of 10 Å/s or more, since the deposition of the semiconductor layers tends to become nonuniform, is especially effective.

The mean value of angles (ψ in the drawing) made by local mountains in the sectional shape of the surface of the transparent conductive layer ranges preferably from 170° to 100°, more preferably from 160° to 110° and still more preferably from 150° to 120°. When the mean value is within these ranges, no defect is caused by the occurrence of a crack in the semiconductor layers on a transparent conductive layer, originating from a stress generated in the semiconductor layer, so that these ranges are preferable. Deposition speed of 10 Å/s or more, since the deposition of the semiconductor layers tends to become nonuniform, especially effective.

The sampling length dx is preferably on the order of ⅓ to ¹⁄₁₀ of the wavelength of the light to be converted into an electric signal by means of a photovoltaic element. When the light of an aim is in the range of ultraviolet, visual and near infrared rays, a sampling length of 20 nm to 100 nm is preferable. A sampling length of 20 nm or more is preferable because a slant due to unevenness not contributing to an increase in short-circuit photocurrent is not measured. A sampling length of 100 nm or less is preferable because there is no problem in that the sampling length is close to the pitch of unevenness to make it impossible to correctly measure the unevenness for a wavelength contributing to an increase in light absorption.

The transparent conductive layer having a surface as described above exhibits the following effects.

Since the surface has an angular distribution appropriate for the desired reflection of light, the optical path length of light reflected from the back face of a photovoltaic element is extended, and the light is reflected in various directions to increase the light absorption of the semiconductor layers 103–105, thereby increasing the short-circuit photocurrent of the photovoltaic element, so that the efficiency of photoelectric conversion is improved.

The close adhesion between a transparent conductive layer and a film (typically a semiconductor layer) stacked thereon is improved, and peeling is eliminated, so that the controllability and degree of freedom in the manufacturing step are improved and simultaneously the yield in the manufacturing step of a photovoltaic element is elevated. Besides, the weather resistance is also improved.

A decrease in the series resistance of a photovoltaic element results in an increase in fill factor, thereby improving the photoelectric conversion efficiency. The principle of a decrease in series resistance has not been clarified, but the decrease is attributable to an increase in adhesion between the transparent conductive layer and the film stacked thereon.

The leakage current of a photovoltaic element decreases and the yield in manufacturing a photovoltaic element is elevated. Besides, the open voltage and fill factor increase while the short-circuit photocurrent of a photovoltaic element is kept at a high value, thereby improving the efficiency of photoelectric conversion. Namely, since a poor deposition of a film is unlikey to be generated where there is no formation of a steep valley portion and a crack due to the stress of a film is unlikely to be generated where there is no formation of a steep mountain portion, the open voltage and fill factor increase on account of light scattering while the short-circuit current of a photovoltaic element is kept at a high value, thereby improving the efficiency of photoelectric conversion.

Besides, since defects caused by local valleys or local mountains in a film deposited on the top of the transparent conductive layer are reduced, the optical deterioration (lowering of photoelectric conversion efficiency due to a long-time light illumination) and vibrational deterioration (lowering of photoelectric conversion efficiency due to a long-time vibration application) of a photovoltaic element are controlled.

With respect to a photovoltaic element using the substrate with a transparent conductive layer of the present invention, the setting range of conditions of removing a short circuit of the defect portion can be wide and the degree of restoration is good in the step of removing a defect as the subsequent step. Besides, there were formerly observed cases where the parts of short circuits removed in the defect portion became traces which could be confirmed even visually, but such a trace cannot be confirmed visually in a photovoltaic element using the substrate with a transparent conductive layer of the present invention. This action is implemented because a stress caused by local valleys or local mountains in a film stacked at the top of the transparent conductive layer is reduced and there is no thinner portion of the film due to an increase in inclination, thereby preventing the local proceeding of a reaction in the region without defects and scarcely resulting in any damages. Further, since the stress is reduced and there is no great defect such as a crack or cavity, the creation of a secondary defect is suppressed and there also no such occurrence where a part of short circuits removed in the defect portion became visually traceable.

Hereinafter, the experiments made by the inventor on the above shape of a transparent conductive layer will be exhibited.

(Experiment 1)

Under the conditions shown below, a transparent conductive layer is formed, the surface is observed on a probe microscope and the inclination arctan (df/dx) is evaluated from the gradient df/dx of a surface sectional shape for a sampling length of 40 nm to obtain a distribution of inclination.

Samples m1 and m2: In the DC magnetron sputtering process, ZnO (99.999%) was used for a target, Xe, $O_2$ and $F_2$ were used for gas species and the amount of $F_2$ was set to 1% (Sample m1) and 5% (Sample m2). The substrate temperature, deposition pressure and deposition speed were set to 200° C., 3 mTorr and 20 Å/s, respectively.

Sample m3: In the DC magnetron sputtering process, ZnO (99.999%) and Ar were used for a target and for gas species, respectively, while the substrate temperature, deposition pressure and deposition speed were set to 200° C., 10 mTorr and 20 Å/s, respectively.

Sample m4: In the DC magnetron sputtering process, ZnO (99.999%) and Ar were used for a target and for gas species, respectively, while the substrate temperature, deposition pressure and deposition speed were set to 200° C., 10 mTorr and 20 Å/s, respectively. The obtained sample was dipped into an aqueous solution of 1% acetic acid+1% aluminum sulfate at 20° C. for 30 sec.

Sample m5: In the DC magnetron sputtering process, ZnO (99.999%) and Ar were used for a target and for gas species, respectively, while the substrate temperature, deposition pressure and deposition speed were set to 200° C., 10 mTorr and 20 Å/s, respectively. The obtained sample was dipped into an aqueous solution of 0.5% sulfuric acid at 30° C. for 20 sec.

Sample m6: This sample was prepared by the electrodeposition process. The used aqueous solution contained 0.05 mol/l of zinc nitride and 0.01 g/l of dextrine as an additive and was maintained at 85° C., and 4-N of 1 mm thick zinc was used for a counter electrode. The aqueous solution was prepared as an aqueous solution of zinc acetate and the applied current was set to 1.0 mA/cm$^2$ (0.1 A/dm$^2$).

Figure 5:
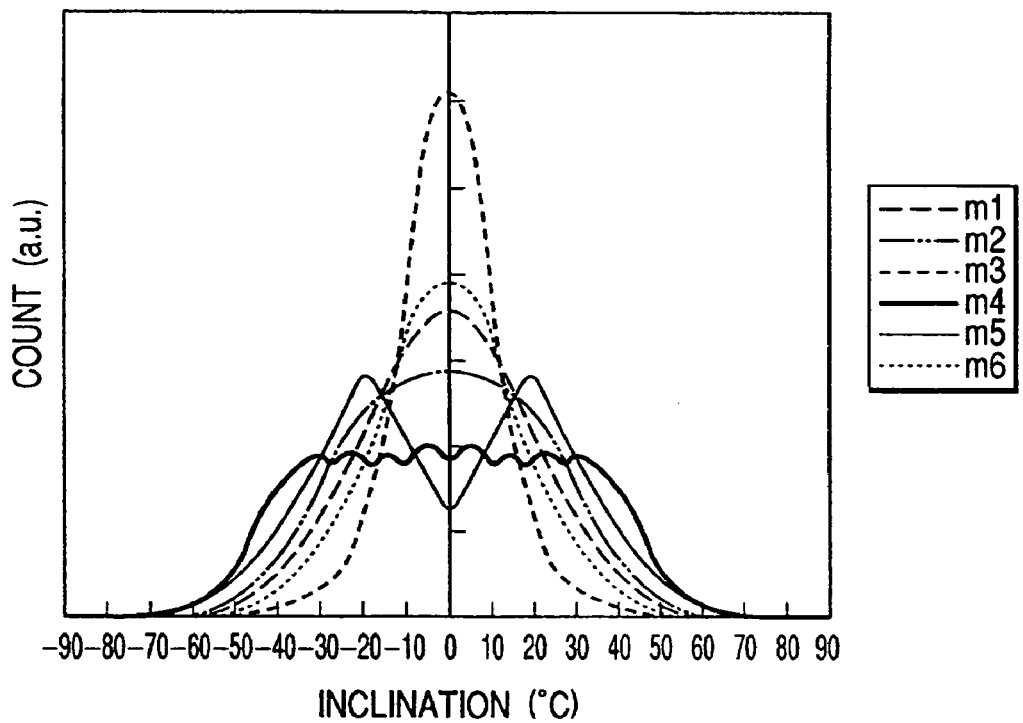
FIG. 5 is a graph showing the distribution of inclinations of the surface of a transparent conductive layer.

FIG. 5 shows the distribution of inclinations under each condition. The standard deviation and kurtosis of inclinations for the respective samples are shown in Table 1.

TABLE 1

| Sample No. | Standard Deviation | Kurtosis |
|---|---|---|
| m1 | 28.3 | 0.03 |
| m2 | 36.5 | −0.13 |
| m3 | 16.2 | 0.51 |
| m4 | 49.6 | −1.19 |
| m5 | 40.7 | −1.42 |
| m6 | 24.6 | 0.10 |

(Experiment 2)

Figure 6:
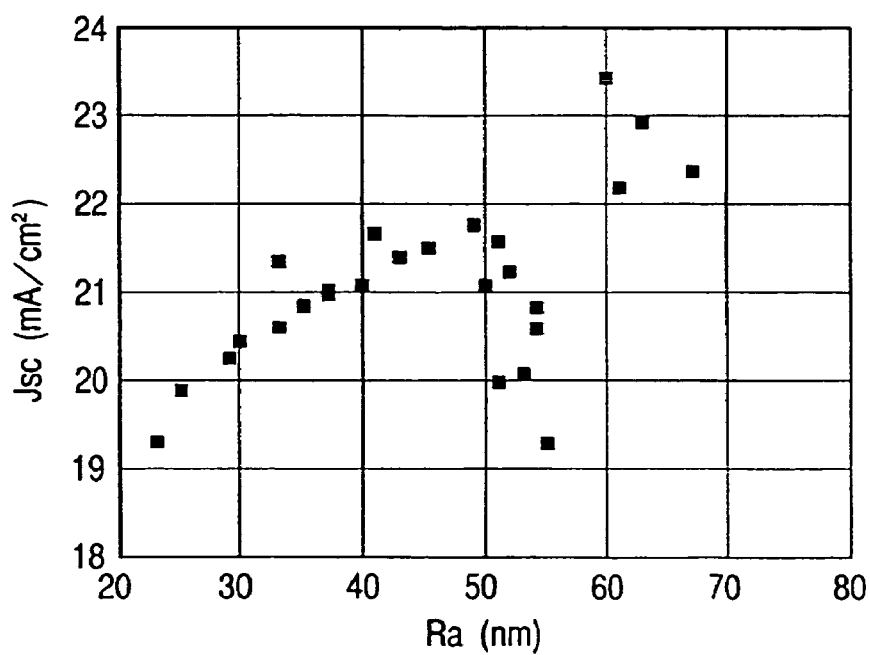
FIG. 6 is a graph showing the relationship between the mean roughness along the central line Ra of the surface of a transparent conductive layer and a short-circuit photocurrent.
Figure 7:
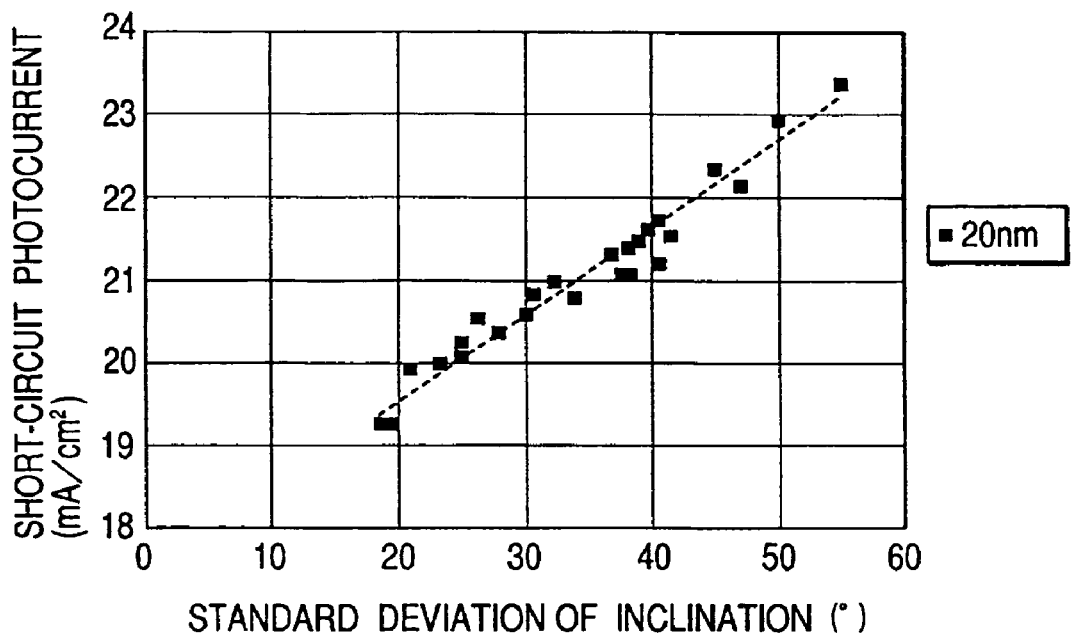
FIG. 7 is a graph showing the relationship between the standard deviation of the distribution of inclinations of the surface of a transparent conductive layer and a short-circuit photocurrent.

Samples were prepared in the same manner as in Experiment 1 to obtain a distribution of inclinations at a sampling length of 20 nm. FIG. 7 shows the relationship between the standard deviation in the distribution of inclinations and a short-circuit photocurrent, and FIG. 6 shows the relationship between the averaged roughness Ra along the center line and the short-circuit photocurrents. As shown in FIGS. 6 and 7, no coincidence of short-circuit photocurrents with the averaged roughness Ra along the center line was detected at the region of a greater Ra, whereas the correlation between the short-circuit photocurrent and the standard deviation in the distribution of inclinations was observed until the element became deficient in function on the account of generated defects.

(Experiment 3)

Under various conditions in the same manner as in Experiment 1, a transparent conductive layer of a 1 μm thick zinc oxide film having a conductivity of $10^{-4}$ (1/Ωcm) was prepared on the supporting substrate (SUS 304) by the magnetron sputtering process. Furthermore, in the same manner as in Example 1, pin amorphous silicon semiconductor layers were stacked as a semiconductor layer thereon to produce a solar cell. The convention efficiency of the solar cell was measured by a method similar to that of Example 1.

Figure 8:
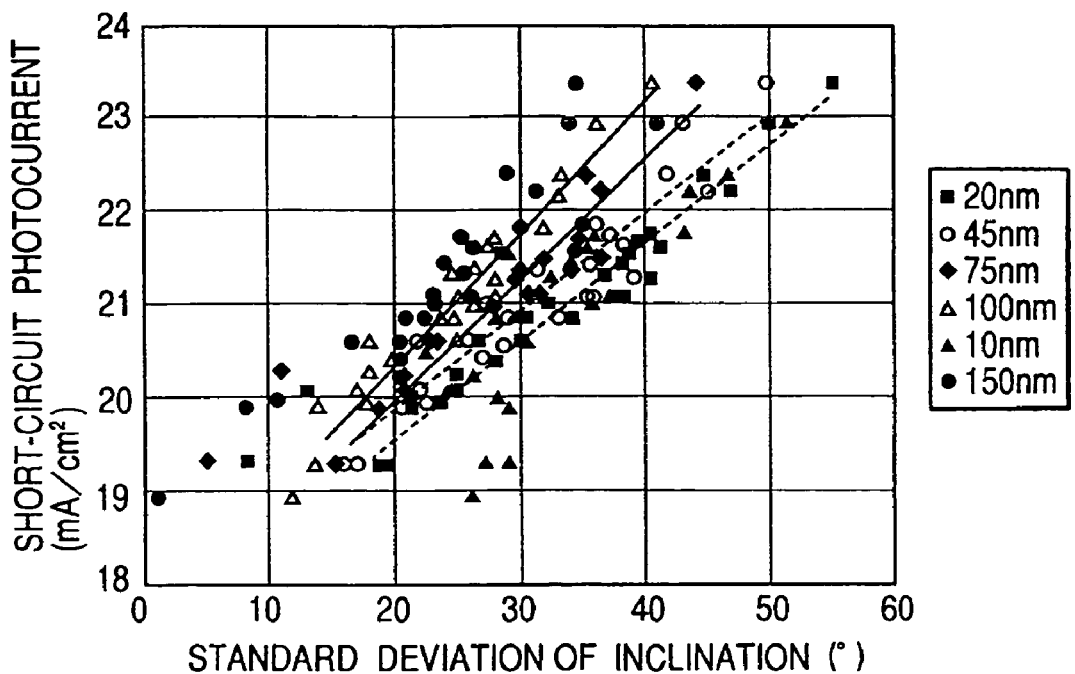
FIG. 8 is a graph showing the relationship between the standard deviation of the distribution of inclinations of the surface of a transparent conductive layer and a short-circuit photocurrent for a parameter of a sampling length.

Comparison was made between the surface shape of a transparent conductive layer and characteristics of the photovoltaic element. Estimation was carried out while changing the sampling length from 10 nm to 150 nm. The relationship between the standard deviation in the distribution of inclinations and the short-circuit photocurrents is shown as a parameter of the sampling length in FIG. 8. As seen from FIG. 8, the correlation between them was found at sampling lengths of 20 nm to 100 nm.

(Metal Layer 108)

When a supporting substrate 101 is a non-light-transmissive substrate insufficient in reflectance, it is preferable to provide a metal layer between the supporting substrate 101 and the transparent conductive layer 102.

The metal layer serves to reflect the long-wavelength light not absorbed in the semiconductor layers 103–105 toward the semiconductor layers 103–105 again and extend the optical path length in the semiconductor layers 103–105 to enhance the optical absorption of the semiconductor layers 103–105, thereby leading to an increase in the short-circuit current (Jsc) of a photovoltaic element.

When a distance of a surface of the metal layer in contact with the transparent conductive layer from the supporting substrate face (virtual plane as mentioned above) is regarded as fm, the surface of the metal layer has the distribution of inclination arctan (dfm/dx) for a sampling length dx ranging from 20 nm to 100 nm that is preferably a normal distribution having a kurtosis of −1.0 to 0.5 around 0° and a standard deviation of 5° to 20°.

By observing the surface of a metal layer, for example, with a probe microscope and evaluating the inclination arctan (dfm/dx) from the gradient dfm/dx of the surface for any sampling length dx, a distribution of inclinations can be obtained.

The kurtosis ranges more preferably from −0.8 to 0.4 and still more preferably from −0.6 to 0.3, whereas the standard deviation ranges more preferably from 7° to 17° and still more preferably from 7° to 15°.

When both values are in the above ranges, an increase in light absorption on the metal surface does not lead to a decrease in reflectance and moreover a small surface area of the metal layer results in a decrease in contact area to the transparent conductive layer 102, thus making a reaction such as diffusion of metal atoms into the transparent conductive layer 102 difficult, so that these ranges are preferable. Besides, when stacking a transparent conductive layer 102 on the metal layer, exposure of the metal layer can be prevented and a short-circuit of the semiconductor layers 103–105 is not caused, so that the ranges are preferable. Furthermore, thin and absent portions of the transparent conductive layer 102 are not produced frequently, while the setting range of conditions of removing an electrically short circuit of the defect portion can be widely chosen and the degree of restoration is good in the step of removing a defect as the subsequent step.

Preferably, the metal layer is mainly made of materials large to diffuse reflectance and difficult in into the transparent conductive layer 102. In particular, a metal such as gold, silver, copper, aluminum, magnesium, nickel, iron, chromium, molybdenum, tungsten, titanium, cobalt, tantalum, niobium or zirconium, or an alloy such as stainless steel can be used. Especially, the metal layer is preferably made of gold, silver, copper, aluminum, magnesium or an alloy thereof.

For forming a metal layer, various evaporation methods, such as EB evaporation and sputtering evaporation, various CVD methods, plating method, printing method and the like are used.

As one example of the metal layer forming method, the sputtering process will be referred to. One example of the sputtering apparatus is shown in FIG. 3.

Figure 3:
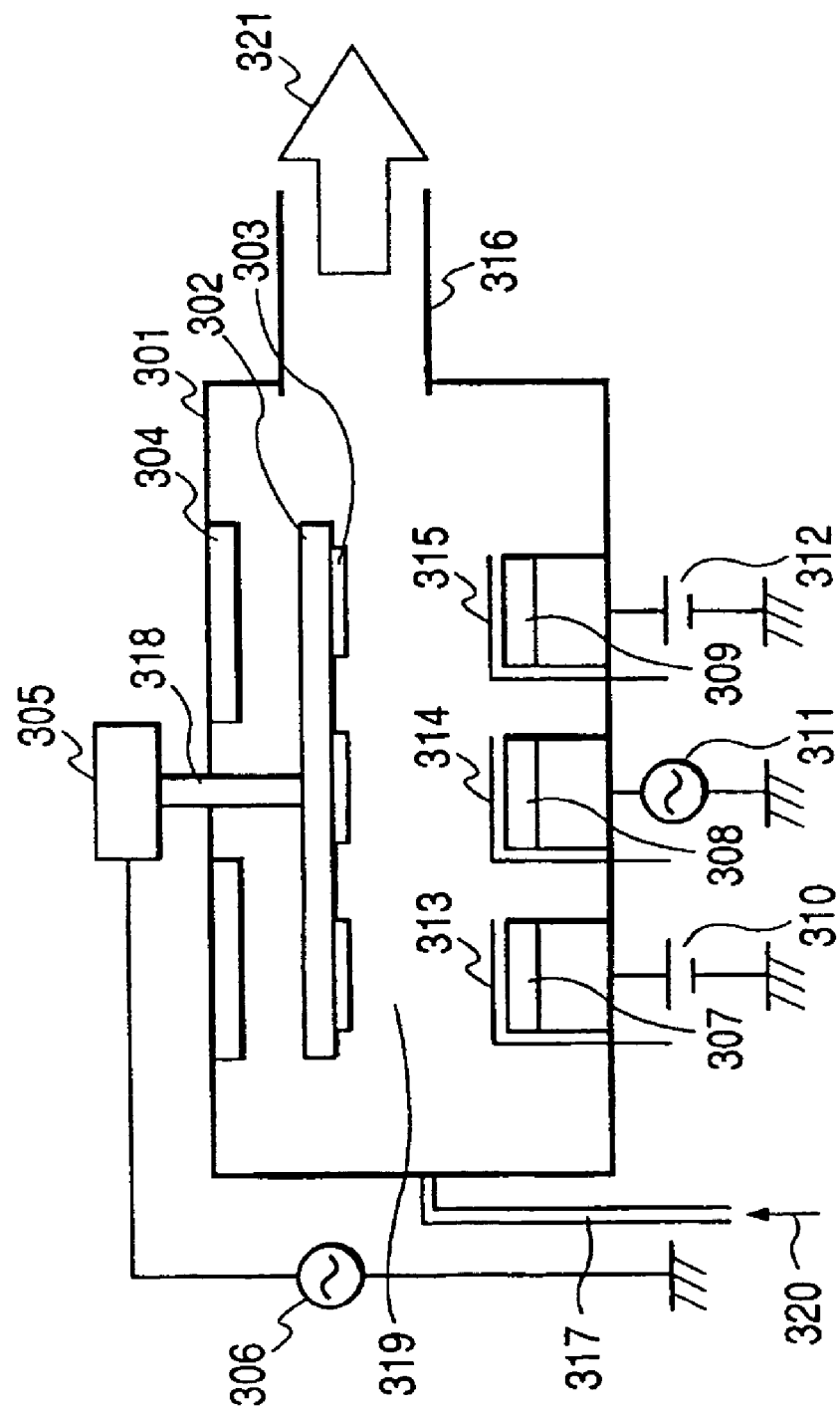
FIG. 3 is a schematic sectional view showing one example of an apparatus for forming a metal layer and a transparent conductive layer for a substrate with a transparent conductive layer according to the present invention.

FIG. 3 is a schematic sectional view showing one example of the apparatus capable of executing the DC magnetron sputtering process, comprising a cylindrical depositing chamber 301, a substrate holder 302, a substrate 303, a heater 304, a matching box 305, an RF power source 306, a metal target 307 for the metal layer, a DC power source 310, an RF power source 311, a DC power source 312, shutters 313–315, an exhaust pipe 316, a gas introducing pipe 317 and a rotating shaft 318, where numeral 319 denotes a space for generating plasma. Aside from these, there are provided a gas feeder connected to the gas introducing pipe 317 and a vacuum pump connected to the exhaust pipe 316, though not shown in the drawings. Besides, numerals 320 and 321 are arrows indicating a direction of gas introduction and a direction of gas exhaust, respectively.

First, the substrate 303 acid-washed and organic solvent-washed is fitted on the discal substrate holder 302 and the rotating shaft 318 as the central shaft of this discal substrate holder 302 is rotated. The interior of the depositing chamber 301 is vacuum exhausted to $10^{-6}$ Torr by using an oil-diffusion pump/rotary pump not shown in the drawings, Ar, $O_2$ and HF are introduced through the gas introducing pipe 317 and RF power is introduced from the RF power source 306 into the interior of the depositing chamber 301 to generate Ar plasma 319. The matching box 305 is adjusted so as to minimize the reflected power. At this time, the substrate 303 is sputter-etched and the surface of the substrate becomes even cleaner.

Next, the heater 304 is set so as to reach the forming temperature of a metal layer. When a predetermined temperature is attained, the DC power source 310 is switched on, Ar plasma is generated and the shutter 313 is opened. When the metal layer is formed by a predetermined thickness, the shutter 313 is closed to switch off the DC power source 310. During the deposition, the temperature and pressure are controlled in accordance with a predetermined pattern. When the film is formed by a predetermined thickness, the shutter is closed to switch off the RF power source 306.

In addition to the apparatus shown in FIG. 3, a metal layer can also be formed by using an apparatus of the roll-to-roll system.

The deposition conditions are not especially limited, but mixing 0.1% to 1% of oxygen stabilizes the deposition reaction, thereby facilitating a predetermined inclination to be obtained and accordingly this mixing is preferable. Besides, setting the substrate temperature to 20° C. to 100° C. makes the inclination of the metal surface moderate and accordingly this setting is preferable.

Hereinafter, experiments on deposition conditions will be described.

A 6 inch diameter Al target was used. A 0.8 mm thick, 50 mm×50 mm surface-ground stainless steel plate (SUS 304) was employed for a substrate. With the distance between the target and the substrate set to 70 mm, the pressure was kept at 20 mTorr while allowing 50 sccm of Ar to flow. On applying 300 V of DC voltage, plasma was generated and 2A of current flowed.

As shown in Table 2, mixing of oxygen on the order of 0.1% to 1% stabilizes the reaction, thereby facilitating a predetermined inclination to be obtained. Besides, the substrate temperature was set to 20° C., 100° C., 200° C. and 300° C., while with elevating temperature, the inclination of the metal surface tended to increase as shown in Table 2. A similar tendency was observed for other metals.

TABLE 2

| Oxygen Concentration | Forming Temperature | | | |
|---|---|---|---|---|
| | 20° C. | 100° C. | 200° C. | 300° C. |
| 0% | ○ | x | x | x |
| 0.1% | ⊚ | ○ | x | x |
| 1% | ⊚ | ⊚ | x | x |
| 2% | ○ | x | x | x |

⊚ A predetermined inclination is obtained.
○ A desired inclination is sometimes obtained, but unstably.
x No desired inclination is obtained.

(Supporting Substrate 101)

Because of about 1 μm in thickness, the semiconductor layers 103–105 are deposited on an appropriate supporting substrate. Such supporting substrates may be single-crystalline or amorphous and further they may be light-transmissive and electrically insulating. Furthermore, they may be transparent or not light-transmissive, but the ones that are hardly deformable, without distortion and having a desired strength are preferable.

In particular, the supporting substrate includes a thin plate of metal such as Fe, Ni, Cr, Al, Mo, Au, Nb, Ta, V, Ti, Pt or Pb, or an alloy thereof such as brass or stainless steel, and a composite thereof; and a film or sheet of a heat resistant synthetic resin such as polyester, polyethylene, polycarbonate, cellulose acetate, polypropylene, polyvinyl chloride, polyvinylidene chloride, polystyrene, polyamide, polyimide or epoxy, and a composite thereof with glass fiber, carbon fiber, boron fiber, metal fiber or the like; and those thin metal plate and resin sheet surface-coated with a metal film of a different material and/or an insulating film such as $SiO_2$, $Si_3N_4$, $Al_2O_3$, AlN or the like by sputtering, evaporation, metal plating or the like; glass; ceramic and the like.

When the supporting substrate is electrically conductive as metal or the like, the supporting substrate may be used as an electrode for the direct takeout of current. When the supporting substrate is electrically insulating, a single metal or alloy such as Al, Ag, Pt, Au, Ni, Ti, Mo, W, Fe, V, Cr, Cu, stainless steel, brass, nichrome, $SnO_2$, $In_2O_3$, ZnO and ITO, and a transparent conductive oxide (TCO) is preferably surface coated on the surface of the formed side of a deposited film in advance by metal plating, evaporating, sputtering or the like to form an electrode for the takeout of current.

Needless to say, even when the supporting substrate is electrically conductive as metal or the like, a metal film or the like of different material may be provided on the above supporting-substrate surface of the formed side of a deposited film for the purpose of improving the reflectance of long-wavelength light on the supporting-substrate surface or preventing the mutual diffusion of constituent elements between the supporting-substrate material and the deposited film. Besides, when the above supporting substrate is relatively transparent, it is preferable to deposit and form conductive films of the transparent conductive oxide mentioned above and metal in advance in case a photovoltaic element utilizing light incidence from the side of the supporting substrate is employed.

When using these materials for a supporting substrate, a sheet-shaped or belt-shaped material for the supporting substrate is preferably wound around a cylinder in a roll form. When a film is formed on a base member to form a supporting substrate, a film forming method such as vacuum evaporation, sputtering, screen printing, dipping or plasma CVD is employed to form a film.

The smoothness of a supporting-substrate surface is better at surface roughness Ra of 5.0 μm or less. Besides, in forming the evenness, an acidic solution such as $HNO_3$, HF, HCl or $H_2SO_4$ may be used to etch the supporting-substrate surface moderately.

When flexibility is required in the supporting substrate, it can be made as thin as possible so that the substrate fully exhibits its function as a support. From the viewpoint of manufacturing or handling a supporting substrate and of a mechanical strength or the like, however, the thickness is normally set to 10 μm or more.

Hereinafter, individual layers of a photovoltaic element using the substrate with a transparent conductive layer of the present invention will be described in details.

(Semiconductor Layers 103–105)

The materials used in the present invention for semiconductor layers include so-called Group IV element such as Si, C and Ge, so-called Group IV element-alloys such as SiGe, SiC and SiSn, so-called Group II–VI element-compounds such as CdS and CdTe, and so-called Group I–III–VI element-compounds such as $CuInSe_2$, $Cu(InGa)Se_2$ and $CuInS_2$.

Besides, as especially preferred ones for a photovoltaic element among these semiconductor materials, an amorphous semiconductor material of Group IV element and Group IV element alloy such as a-Si:H (abbreviated representation of hydrogenated amorphous silicon), a-Si:F, a-Si:H:F, a-SiGe:H, a-SiGe:F, a-SiGe:H:F, a-SiC:H, a-SiC:F or a-SiC:H:F, a microcrystalline semiconductor material or a polycrystalline semiconductor material is referred to.

Besides, the semiconductor layer is subjected to valence electron control or bandgap width control. To be concrete, it is only necessary to introduce a source compound containing an element serving for valence electron control or bandgap width control agent alone or its mixture with the above deposited film forming gas or diluent gas into the film-forming space.

Besides, a semiconductor layer is at least partly doped into a p-type or n-type one by the valence electron control to form one set of pin junction. And by stacking multiple pin junctions, a construction of so-called stack cell is formed.

Besides, semiconductor layers are formed by various CVD methods such as micro wave plasma CVD, RF plasma CVD, optical CVD, thermal CVD or MOCVD, various evaporation methods such as EB evaporation, MBE, ion plating and ion beam evaporation, sputtering evaporation, spray method, printing method or the like. As an industrially employed method, a plasma CVD process comprising decomposing a source gas by plasma and depositing it on the substrate is preferably used. And, as a reaction apparatus, a batch-type apparatus or a continuous film-forming apparatus can be used.

Hereinafter, semiconductor layers using an amorphous semiconductor material based on a Group IV element or a group IV element alloy especially preferable for a photovoltaic element according to the present invention will be described in further detail.

(1) i-type Semiconductor Layer (Intrinsic Semiconductor Layer)

Especially in a photovoltaic element using an amorphous semiconductor material based on a Group IV element or a group IV element alloy, the i-type layer for a pin junction is a layer important for generating and transporting carriers in response to radiated light.

As the i-type layer, a slight p-type or n-type layer can be used.

In a non-monocrystalline Group IV element or Group IV element alloy based semiconductor materials, as mentioned above, hydrogen atoms (H, D) or halogen atoms (X) are contained, which have an important action.

Hydrogen atoms (H, D) or halogen atoms (X) contained in an i-type layer act to compensate dangling bonds of the i-type layer, thereby improving the product of the mobility and the life of carriers on the i-type layer. Besides, they act to compensate the interface potential level in the respective interfaces of p-type/i-type layers or n-type/i-type layers and are effective in improving the photoelectromotive force, photocurrent and optical response of a photovoltaic element. With respect to hydrogen atoms and/or halogen atoms contained in the i-type layer, a content of 1 to 40 atomic % is mentioned as most suitable. Especially, the larger content of hydrogen atoms and/or halogen atoms on the side of the respective interfaces of the p-type/i-type layers or n-type/i-type layers is referred to as a preferred form of distribution and the content of hydrogen atoms and/or halogen atoms near the interface ranging preferably from 1.1 to 2 times that of the bulk interior. Furthermore, the content of hydrogen atoms and/or halogen atoms preferably varies corresponding to that of silicon atoms.

Besides, as materials of an i-type semiconductor layer of pin junction close to and far from the light incident side in a stack-type photovoltaic element, materials having a broad bandgap and those having a narrow one are preferably used, respectively.

Together with elements compensating dangling bonds, an amorphous silicon and amorphous silicon germanium are designated as a-Si:H, a-Si:F, a-Si:H:F, a-SiGe:H, a-SiGe:F, a-SiGe:H:F or the like, respectively.

Furthermore, as characteristics of an i-type semiconductor layer appropriate for a photovoltaic element according to the present invention, the content of hydrogen atoms (CH) is 1.0% to 25.0%, the photoconductivity ($\sigma$p) of under irradiation of solar-like light at AM 1.5, 100 mW/cm$^2$ is $1.0 \times 10^{-7}$ S/cm or more, the dark conductivity ($\sigma$d) is $1.0 \times 10^{-9}$ S/cm or less, the Urbach energy obtained by the constant photocurrent method (CPM) is 55 meV or lower and the local level density is $10^{17}$/cm$^3$ or lower.

(2) P-type or N-type Semiconductor Layer

As amorphous materials (represented by "a-") or microcrystalline materials (represented by "$\mu$c-") of a p-type or n-type semiconductor layer, for example, materials obtained by adding p-type valence electron control agent (Group III atoms of B, Al, Ga, In or Tl in the periodic table) or n-type valence electron control agent (Group V atoms of P, As, Sb or Bi in the periodic table) at a high concentration to a-Si:H, a-Si:HX, a-SiC:H, a-SiC:HX, a-SiGe:H, a-SiGe:HX, a-SiGeC:H, a-SiGeC:HX, a-SiO:H, a-SiO:HX, a-SiN:H, a-SiN:HX, a-SiON:H, a-SiON:HX, a-SiOCN:H, a-SiOCN:HX, $\mu$c-Si:H, $\mu$c-Si:HX, $\mu$c-SiC:H, $\mu$c-SiC:HX, $\mu$c-SiO:H, $\mu$c-SiO:HX, $\mu$c-SiN:H, $\mu$c-SiN:HX, $\mu$c-SiGeC:H, $\mu$c-SiGeC:HX, $\mu$c-SiON:H, $\mu$c-SiON:HX, $\mu$c-SiOCN:H, $\mu$c-SiOCN:HX and the like are referred to.

As polycrystalline materials (represented by "poly-"), for example, materials obtained by adding p-type valence electron control agent (Group III atoms of B, Al, Ga, In or Tl in the periodic table) or n-type valence electronic control agent (Group V atoms of P, As, Sb or Bi in the periodic table) at a high concentration to poly-Si:H, poly-Si:HX, poly-SiC:H, poly-SiC:HX, poly-SiO:H, poly-SiO:HX, poly-SiN:H, poly-SiN:HX, poly-SiGeC:H, poly-SiGeC:HX, poly-SiON:H, poly-SiON:HX, poly-SiOCN:H, poly-SiOCN:HX, poly-Si, poly-SiC, poly-SiO, poly-SiN and the like are referred to.

Especially, for a p-type or n-type layer on the light incident side, a crystalline semiconductor layer with small light absorption or an amorphous semiconductor layer with wide band gap is appropriate.

The amount of Group III atoms in the periodic table added to a p-type layer and that of Group V atoms added to an n-type layer are preferably 0.1 to 50 atomic %.

Besides, hydrogen atoms (H, D) or halogen atoms contained in the p-type or n-type layer act to compensate dangling bonds of the p-type or n-type layer, thereby improving the doping efficiency of the p-type or n-type layer. The amount of hydrogen or halogen atoms added to the p-type or n-type layer is preferably 0.1 to 40 atomic %. Especially when the p-type or n-type layer is crystalline, 0.1 to 8 atomic % of hydrogen or halogen atoms is preferable. Furthermore, a greater content of hydrogen atoms and/or halogen atoms on the side of the respective interfaces of the p-type/i-type layers or n-type/i-type layers are mentioned as a preferred form of distribution, while the content of hydrogen atoms and/or halogen atoms near the interface ranged preferably from 1.1 to 2 times that of the bulk interior. Like this, by elevating the content of hydrogen atoms and/or halogen atoms near the respective interface the p-type/i-type layers or n-type/i-type layers, the defect state or mechanical distortion near the relevant interface can be reduced, thereby enabling the photoelectromotive force or photocurrent of a photovoltaic element according to the present invention to be increased.

An electric characteristics of the p-type and n-type layers in a photovoltaic element, the activation energy is preferably 0.2 eV or lower and more preferably 0.1 eV or lower. And, a value of specific resistance is preferably 100 $\Omega$cm or lower and more preferably 1 $\Omega$cm or lower. Furthermore, the thickness of the p-type and n-type layer is preferably 1 to 50 nm and more preferably 3 to 10 nm.

Examples of materials for the p-type or n-type semiconductor layer using Group II–IV elements include CdS, CdTe and ZnSe, and examples using Group I–III–VI elements include CuInSe$_2$, Cu(InGa)Se$_2$, CuInS$_2$, CuIn(Se, S)$_2$ and CuInGaSeTe.

(3) Method for Forming Semiconductor Layer

To form an amorphous semiconductor layer based on Group IV element and Group IV element alloy appropriate as the semiconductor layer of a photovoltaic element according to the present invention, the plasma CVD method such as RF plasma CVD or micro wave plasma CVD using AC or high frequency wave is preferably applied.

The micro wave plasma CVD method comprises introducing material gases such as a source gas and a diluent gas into a depositing chamber (vacuum chamber) capable of leading to a reduced pressure, while evacuating by using a vacuum pump to keep the internal pressure of the depositing chamber constant, guiding a micro wave oscillated by a micro wave power source through a wave guide into the above depositing chamber via a dielectric window (made of alumina ceramics or the like), and exciting and decomposing the plasma of material gases to form a desired deposited film on a substrate disposed in the depositing chamber. By this method a deposited film applicable to a photovoltaic element can be formed under a wide variety of conditions of deposition.

In the case of depositing semiconductor layers for a photovoltaic element according to the present invention by the micro wave plasma CVD method, the range of 100° C. to 450° C., that of 0.5 to 30 mTorr, that of 0.01 to 1 W/cm$^3$ and that of 0.1 to 10 GHz are preferable for the substrate temperature inside the depositing chamber, the internal pressure, the micro wave power and the frequency of a microwave, respectively.

Besides, in the case of depositing semiconductor layers by the RF plasma CVD method, the range of 100° C. to 350° C., that of 0.1 to 10 Torr, that of 0.001 to 5.0 W/cm$^2$ and that of 0.1 to 30 Å/sec are preferable for the substrate temperature inside the depositing chamber, the internal pressure, the RF power and the deposition speed, respectively.

As source gases appropriate for the deposition of an amorphous semiconductor layer of Group IV element and Group IV element alloy appropriate for the semiconductor layer of a photovoltaic element according to the present invention, gasifiable compounds containing silicon atoms, gasifiable compounds containing germanium atoms, gasifiable compounds containing carbon atoms and gas mixtures of the above compounds can be referred to.

In particular, as gasifiable compounds containing silicon atoms, chained or cyclic silane compounds are used. Their examples are gaseous or easily gasifiable compounds such as $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$ and $Si_2Cl_3F_3$.

Specifically, as gasifiable compounds containing germanium atoms, $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, $Ge_2D_6$, etc. are referred to.

Besides, as elements for expanding the band gap of an i-type semiconductor layer of pin junction near the light incident side of a stack-type photovoltaic element, carbon, oxide, nitrogen or the like are referred to.

In particular, as gasifiable compounds containing carbon atoms, $CH_4$, $CD_4$, $C_nH_{2n+2}$ (n: integer), $C_nH_{2n}$ (n: integer), $C_2H_2$, $C_6H_6$, $CO_2$, $CO$, etc. are referred to.

As nitrogen-contained gases, $N_2$, $NH_3$, $ND_3$, $NO$, $NO_2$, $N_2O$ are referred to.

As oxygen-contained gases, $O_2$, $CO$, $CO_2$, $NO$, $NO_2$, $N_2O$, $CH_3CH_2OH$, $CH_3OH$, etc. are referred to.

Besides, as substances to be introduced into a p-type or n-type layer for the valence electron control, Group III atoms or Group V atoms in the periodic table are referred to.

As compounds effectively used for starting substances for introduction of Group III atoms, hydrogenated boron such as $B_2H_6$, $B_4H_{10}$, $B_5H_9$, $B_5H_{11}$, $B_6H_{10}$, $B_6H_{12}$ or $B_6H_{14}$ and boron halogenide such as $BF_3$ or $BCl_3$ are referred to specifically. In addition to these, $AlCl_3$, $GaCl_3$, $InCl_3$, $TlCl_3$ or the like can be referred to. Especially, $B_2H_6$ and $BF_3$ are appropriate.

As compounds effectively used for starting substances in introducing Group V atoms, hydrogenated phosphorus such as $PH_3$ or $P_2H_4$, and phosphorus halogenide such as $PH_4$, $PF_3$, $PF_5$, $PCl_3$, $PCl_5$, $PBr_3$, $PBr_5$ or $PI_3$ are referred to specifically for the introduction of phosphorous atoms. In addition to these, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$ or the like can be referred to. Especially, $PH_3$ and $PF_3$ are appropriate.

Besides, the gasifiable compounds mentioned above may be diluted properly with a gas such as $H_2$, He, Ne, Ar, Xe or Kr before being introduced into a depositing chamber.

Especially in the case of depositing a small light absorption and wide band gap layer of a microcrystalline or polycrystalline semiconductor, a-SiC:H or the like, the source gas is preferably diluted with hydrogen gas by a factor of 2–100 and a relatively high micro wave or RF power is preferably introduced.

(Transparent Electrode 106)

In the present invention, the transparent electrode is not only an electrode on the light incident side transmitting light. It also plays a role of the antireflection film by optimizing the thickness. It is required for a transparent electrode to have high transmittance in a region of absorptive wavelength for the semiconductor layers 103–105 and to have a low resistivity. The transmittance in wavelengths of 550 nm or more is preferably 80% or more and more preferably 85% or more, while the resistivity is preferably $5 \times 10^{-3}$ Ωcm or less and more preferably $1 \times 10^{-3}$ Ωcm or less.

As its material, conductive oxide such as $In_2O_3$, $SnO_2$, ITO ($In_2O_3+SnO_2$), ZnO, CdO, $Cd_2SnO_4$, $TiO_2$, $Ta_2O_5$, $Bi_2O_3$, $MoO_3$ or $Na_xWO_3$, or a mixture of these is preferably used. Further preferred materials are metal oxides selected from $SnO_2$, $In_2O_3$ and ITO or their complex oxides.

Besides, an element (dopant) changing the conductivity may be added to these compounds. For example, Al, In, B, Ga and SiF for a transparent electrode of ZnO; Sn, F, Te, Ti and Pb for $In_2O_3$; and F, Sb, P, As, In, Tl, Te, W, Cl, Br and I for $SnO_2$ are preferably used, respectively.

To form a transparent electrode, various evaporation methods such as EB evaporation and sputtering evaporation, various CVD methods, the spray process, the spin-on process, the dip process, etc. are preferably used.

(Collector Electrode 107)

When the resistivity of a transparent electrode 106 cannot be set to a sufficiently low value in the present invention, a collector electrode is formed in part on the transparent electrode 106 according to the need and acts to lower the resistivity of the transparent electrode 106, thereby reducing the series resistance of a photovoltaic element.

As its materials, a metal such as gold, silver, copper, aluminum, nickel, iron, chromium, molybdenum, tungsten, titanium, cobalt, tantalum, niobium or zirconium, an alloy such as stainless steel or a conductive paste using a powdery metal is referred to. And, its shape is formed so as not to shield the incident light to the semiconductor layers 103–105.

Besides, the area occupied by the collector electrode among the area of the light incident surface of a photovoltaic element is preferably 15% or less, more preferably 10% or less and still more preferably 5% or less.

Furthermore, in forming a pattern of the collector electrode, a mask is used, and the evaporation method, the sputtering method, the metal plating method or the printing method is used to form a collector electrode.

Incidentally, in the case of manufacturing a photovoltaic element (module or panel) of a desired output voltage and output current by using a photovoltaic element according to the present invention, photovoltaic elements according to the present invention are connected in series or in parallel to form a protective layer on the front surface and on the back surface, to which a takeout electrode of output or the like is fitted. At this time, the supporting substrate 101 having a photovoltaic element formed thereon may be disposed on another substrate. In the case of connecting photovoltaic elements according to the present invention in series, a diode for the prevention of a backflow current may be incorporated.

Hereinafter, referring to the Examples, the present invention will be described in further details. Estimation methods employed in the Examples are as follows.

(1) Initial Efficiency of Photoelectric Conversion

With a solar cell installed under irradiation of AM-1.5 (100 mW/cm$^2$) light, V-I characteristics were measured.

(2) Test of Optical Deterioration

Under the irradiation of AM-1.5 light for 500 hours, the solar cell whose initial efficiency of photoelectric conversion was measured in advance was installed in environments of a 50% humidity and 25° C. temperature, and then photoelectric conversion under irradiation of AM-1.5 light was measured to calculate a ratio of reduction (efficiency of photoelectric conversion after the test of optical deterioration/initial efficiency of photoelectric conversion).

(3) Test of Vibrational Deterioration

After a 0.1 mm amplitude vibration was applied at a vibrational frequency of 60 Hz for 500 hours with the solar cell, whose initial efficiency of photoelectric conversion was measured in advance, installed in the dark at 50% humidity and 25° C. temperature, the efficiency of photoelectric conversion under irradiation of AM-1.5 light was measured to calculate a ratio of reduction (efficiency of photoelectric conversion after the test of vibrational deterioration/initial efficiency of photoelectric conversion).

(4) Reverse Bias Test at High Temperature and High Humidity

After a reverse bias of −0.85 V was applied for 500 hours to the solar cell whose initial efficiency of photoelectric conversion was measured in advance, while installing in the dark at 85% humidity and 85° C. temperature, the leakage current was measured to calculate its rate of increase (leakage current after the reverse bias test at high temperature and high humidity/initial leakage current).

EXAMPLE 1

Initially, a transparent conductive layer 102 was deposited using the depositing apparatus shown in FIG. 3 to prepare a substrate with the transparent conductive layer.

First, preparation of a supporting substrate 101 was carried out. A 1.1 mm thick, 50×50 mm$^2$ glass substrate (#7059) manufactured by Corning Company was ultrasonically cleaned with acetone and isopropanol and dried by a warm wind.

To the depositing apparatus shown in FIG. 3, a source gas supply device (not shown in the drawings) is connected through a gas introducing pipe 317. The source gas cylinders, all of which were of ultrahigh purity, comprises an Ar, Xe O$_2$ and F$_2$ gas cylinders. There are targets of Al and ZnO, both of which can be switched for sputtering in vacuum. As the bias power source, an RF power source 311 was used.

On the substrate holder 302 of FIG. 3, a substrate 303 was placed. Through an exhaust pipe 316 with an oil diffusion pump connected, the depositing chamber 301 was vacuum exhausted. When the pressure was reduced to 1×10$^{-6}$, a gas mixture comprising 50 sccm of Xe gas, 5 sccm of O$_2$ gas and a predetermined amount of F$_2$ gas within the range of 0% to 50% in the total flow was introduced through the gas introducing pipe 317 into the depositing chamber 301 and a conductance valve (not shown in the drawings) was adjusted so as to turn the pressure to 9 mTorr. When the substrate temperature reached to 200° C., 300 W of RF power were applied to a target 308 for forming the transparent conductive layer from the RF power source 311 to generate a plasma in the space 319. The shutter 314 was opened to start the deposition of a film. The deposition speed was set to 20 Å/s.

Once a 2.0 μm thick ZnO transparent conductive layer 102 was formed on the supporting substrate 101, the shutter 314 was closed to vanish the plasma. The conductivity of the transparent conductive layer 102 was 10$^{-4}$ (1/Ωcm).

At this time, samples of (SC Example 1-1), (SC Example 1-2), (SC Comparative Example 1-1) and (SC Comparative Example 1-2) were prepared at varied ratios of F$_2$. And, the distribution of inclinations in the surface shape of the transparent conductive layer 102 was measured at a sampling length of 40 nm. The result is shown in Table 3.

Figure 4:
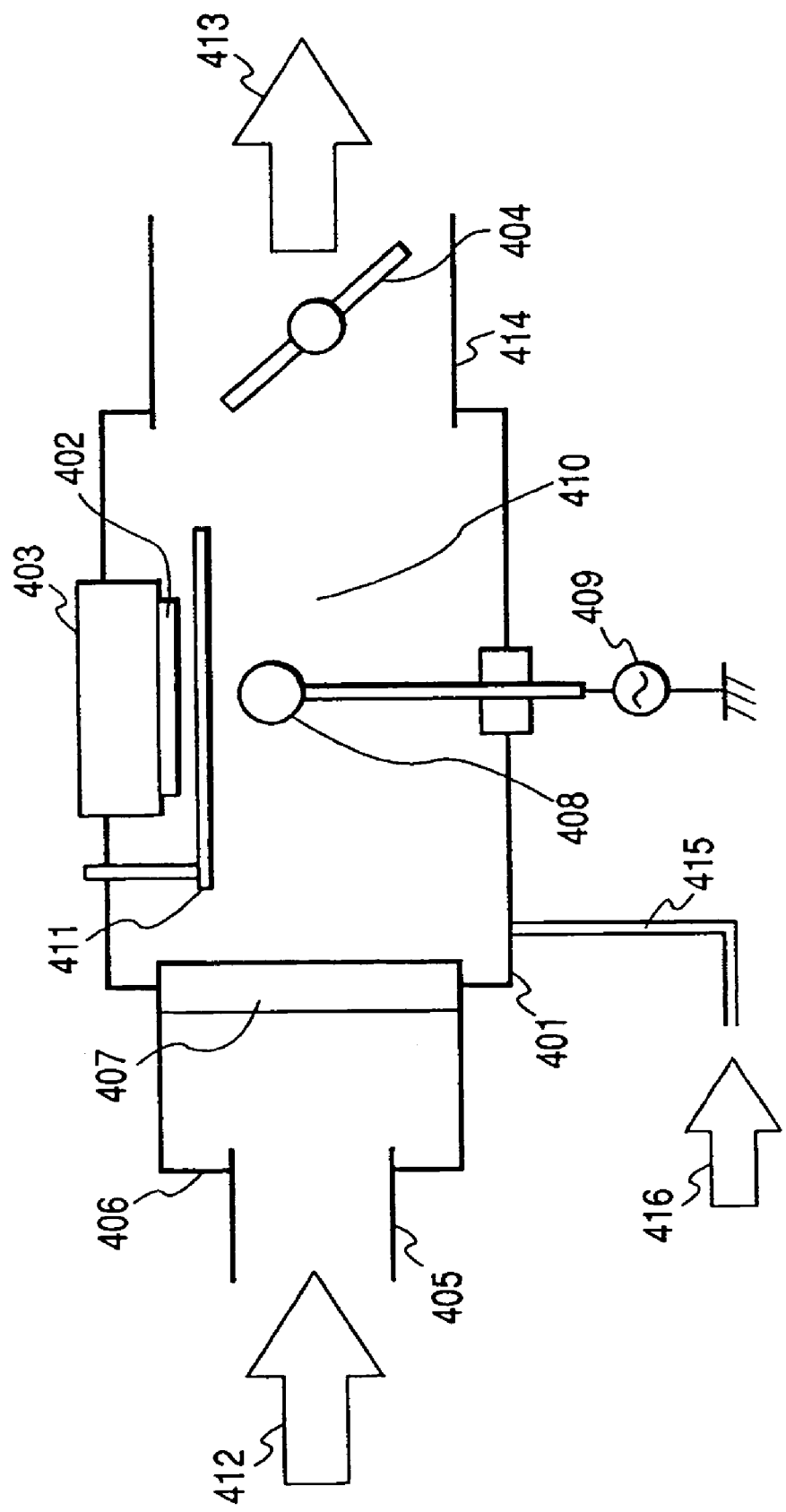
FIG. 4 is a schematic sectional view showing one example of an apparatus for forming a semiconductor layer in a photovoltaic element according to the present invention.

Next, using the depositing apparatus shown in FIG. 4, the semiconductor layers 103–105 were deposited to produce a solar cell constructed as shown in FIG. 1A.

First, using the apparatus shown in FIG. 4, an n-type semiconductor layer 103, an i-type semiconductor layer 104 and a p-type semiconductor layer 105 were formed in sequence on the transparent conductive layer 102. The n-type semiconductor layer 103 comprising a-Si, the i-type semiconductor layer 104 comprising a-Si and the p-type semiconductor layer 105 comprising μc-Si were formed by the RF plasma CVD, by the MW (micro wave) plasma CVD and by the RF plasma CVD, respectively.

FIG. 4 is a schematic sectional view showing one example of an apparatus capable of executing the plasma CVD method, comprising a reaction chamber 401, a substrate 402 with a transparent conductive layer 102 formed thereon, a heater 403, a conductance valve 404, a micro wave introducing pipe 405, a micro wave introducing portion 406, a micro wave introducing window 407 made of alumina ceramics, an RF introducing portion 408, an RF power source 409 with the matching circuit built therein, a space for generating plasma 410, a shutter 411, an exhaust pipe 414 and a gas introducing pipe 415, where numerals 412, 413 and 416 denote the traveling direction of a micro wave, the direction of exhaust and the introducing direction of gases, respectively. Although not shown in FIG. 4, the micro wave power source and the vacuum pump are connected to the micro-wave wave guide 405 and the exhaust pipe 414, respectively.

Besides, a source gas supply device (not shown in the drawings) is connected through the gas introducing pipe 415. Every source gas cylinder is of ultrahigh purity. An SiH$_4$, SiF$_4$, CH$_4$, GeH$_4$, PH$_3$/H$_2$ (PH$_3$: 1%), a B$_2$H$_6$/H$_2$ (B$_2$H$_6$: 1%) and H$_2$ gas cylinders were connected to the source gas supply device.

Actually forming a layer by using a micro wave CVD process in this plasma CVD apparatus proceeds in accordance with the following procedure.

First, the substrate 402 with a transparent conductive layer 102 also formed thereon is fitted on a heater 403 inside the reaction chamber 401 and the reaction chamber 401 is evacuated by using a vacuum pump such as an oil diffusion pump to reduce its internal pressure to 1×10$^{-4}$ Torr or less. When the pressure decreased to 1×10$^{-4}$ Torr or less, a gas such as H$_2$ or He is introduced through the gas introducing pipe 415 into the reaction chamber 401 and the heater 403 was switched on and set to heat the substrate 402 to a predetermined temperature. Once the temperature of the substrate 402 was stabilized, a source gas is introduced through the gas introducing pipe 415 and microwave power is supplied through the microwave guide 405, the microwave introducing portion 406 and the microwave introducing window 407 into the reaction chamber 401 from a microwave power source which is not shown in the drawings. Once a plasma 410 is generated, the conductance valve 404 is adjusted to allow the internal pressure to become a desired one, the RF power source 409 is switched on to supply the RF power through the RF introducing portion 408. At that time, it is advisable to adjust the matching circuit and to minimize the reflected power. Next, once the shutter 411 is opened and a layer having a predetermined thickness is formed, the shutter 411 is closed to stop the introduction of RF power, microwave power and the source gas, and subsequent layers are prepared.

Hereinafter, description will be made specifically for each layer.

First, an n-type semiconductor layer 103 comprising a-Si was formed in accordance with the following procedure. Once the internal pressure of the reaction chamber 401 and the substrate temperature are stabilized at 1.0 Torr and 250° C., respectively, after the introduction of H$_2$ gas at 300 sccm, SiH$_4$ gas, PH$_3$/H$_2$ gas and H$_2$ gas are introduced at 2 sccm, 2 sccm and 100 sccm, respectively, and the internal pressure of the reaction chamber 401 was adjusted to 10 Torr. The power of the RF power source 409 was set to 5 W, the RF power was applied to the bias electrode to generate a plasma at a space 410 and the shutter 411 was opened to start the formation of an n-type semiconductor layer 103 on the transparent conductive layer 102. Once a 20 nm thick n-type semiconductor layer 103 was formed, the shutter 411 was closed and the RF power source 409 was turned off to stop the plasma and terminate the formation of the n-type semiconductor layer 103. The inflow of $SiH_4$ gas and $PH_3/H_2$ gas into the reaction chamber 401 was stopped, then, after $H_2$ gas continued to flow for 2 minutes, the inflow of $H_2$ gas was also stopped to vacuum exhaust the interior of the reaction chamber 401 and that of the gas piping down to $1 \times 10^{-5}$ Torr.

Secondly, an i-type semiconductor layer 104 comprising a-Si was formed in accordance with the following procedure. $H_2$ gas is introduced at 500 sccm and the internal pressure of the reaction chamber and the substrate temperature were set to 0.01 Torr and 350° C., respectively. Once the substrate temperature was stabilized, $SiH_4$ gas is introduced and an adjustment was made to allow the flow rate of $SiH_4$ gas and $H_2$ gas and the internal pressure of the reaction chamber 401 to become 50 sccm, 500 sccm, and 0.02 Torr, respectively. Thereafter, the power of the MW power source was set to 500 W, the MW power was introduced through the dielectric window to generate a plasma 410 and the shutter 411 was opened to start the formation of an i-type semiconductor layer 104 on the n-type semiconductor layer 103. Once a 200 nm thick i-type semiconductor layer 104 was formed, the shutter 411 was closed and the MW power source was turned off to stop the plasma 410, thereby terminating the formation of the i-type semiconductor layer 104. The inflow of $SiH_4$ gas was stopped, then, after $H_2$ gas continued to flow for 1 minute, the inflow of $H_2$ gas was also stopped to vacuum exhaust the interior of the reaction chamber 401 and that of the gas piping down to $1 \times 10^{-5}$ Torr.

Thirdly, a p-type semiconductor layer 105 comprising μc-Si was formed in accordance with the following procedure. $H_2$ gas is introduced at 500 sccm, and the internal pressure of the reaction chamber 401 and the substrate temperature were set to 1.0 Torr and 200° C., respectively. Once the substrate temperature was stabilized, $SiH_4$ gas and $BF_3/H_2$ gas were introduced. At this time, an adjustment was made to allow the flow rate of $SiH_4$ gas, $H_2$ gas, $BF_3/H_2$ gas and the internal pressure to become 2 sccm, 100 sccm, 500 sccm and 1.0 Torr, respectively. Thereafter, the power of the RF power source 409 was set to 50 W to generate a plasma in a space 410 and the shutter 411 was opened to start the formation of an p-type semiconductor layer 105 on the i-type semiconductor layer 104. Once a 10 nm thick p-type semiconductor layer 105 was formed, the shutter 411 was closed and the RF power source 409 was turned off to stop the plasma, thereby terminating the formation of the p-type semiconductor layer 105. The inflow of $SiH_4$ gas and $BF_3/H_2$ gas was stopped, then, after $H_2$ gas continued to flow for 2 minutes, the inflow of $H_2$ gas was also stopped to vacuum exhaust the interior of the reaction chamber 401 and that of the gas piping down to $1 \times 10^{-5}$ Torr and the reaction chamber 401 was leaked.

Fourth, on the p-type semiconductor layer 105, a 70 nm thick ITO was vacuum deposited as a transparent electrode 106 by the resistor-heating vacuum deposition process.

Fifth, with a mask having a comb-shaped hole placed on the transparent electrode 106, a comb-shaped collector electrode 107 composed of Cr(40 nm)/Ag(1000 nm)/Cr(40 nm) was vacuum deposited by the electron beam vacuum deposition process.

By the above procedures, the production of a solar cell was terminated. The estimated result is shown in Table 3. Meanwhile, estimation is indicated in terms of relative values when the value of (SC Example 1-1) is regarded as 1. The difference between (SC Example 1-1) and (SC Comparative Example 1-1) mainly originates in the difference of fill factors and that of short-circuit currents.

TABLE 3

| Sample No. | Sampling Length (nm) | Distribution of Inclinations | Standard Deviation of Inclinations | Kurtosis of Distribution of Inclinations | Average of Angles in Local Valleys | Average of Angles in Local Mountains | Conductivity (1/Ωcm) | Initial Conversion Efficiency | After Optical Deterioration | After Vibrational Deterioration | After Reverse Bias Test at High-Temperature and High-Humidity | Total Estimation |
|---|---|---|---|---|---|---|---|---|---|---|---|---|
| SC Example 1-1 | 40 | * | 30 | 0.2 | 145 | 135 | $10^{-4}$ | 1.00 | 1.00 | 1.00 | 1.00 | ◎ |
| SC Example 1-2 | 40 | * | 45 | 0.1 | 133 | 121 | $10^{-4}$ | 1.05 | 0.99 | 0.98 | 1.05 | ◎ |
| SC Compar. Ex. 1-1 | 40 | * | 15 | 0.4 | 151 | 148 | $10^{-4}$ | 0.87 | 0.89 | 0.95 | 1.00 | x |
| SC Compar. Ex. 1-2 | 40 | * | 56 | -0.5 | 142 | 138 | $10^{-4}$ | 0.98 | 0.85 | 0.83 | 5.69 | x |

*Normal distribution around 0°
◎: Excellent
x: Bad

EXAMPLE 2

On a supporting substrate 101 (SUS 304), a 1 μm thick transparent conductive layer 102 having a conductivity of $10^{-4}$ (1/Ωcm) was formed under various conditions by the DC magnetron sputtering process in the same manner as in Example 1. The samples obtained were etched for several seconds in 2% of acetic acid at varied temperatures to prepare various specimens. A distribution of inclinations in the surface was evaluated at a sampling length of 20 nm. The result is shown in Table 4.

In the same manner as in Example 1, solar cells of pin amorphous silicon semiconductor were produced by stacking the semiconductor layers 103–105. The estimated result is shown in Table 4.

TABLE 4

| Sample No. | Sampling Length (nm) | Distribution of Inclinations | Standard Deviation of Inclinations | Kurtosis of Distribution of Inclinations | Average of Angles in Local Valleys | Average of Angles in Local Mountains | Conductivity (1/Ωcm) | Initial Conversion Efficiency | After Optical Deterioration | After Vibrational Deterioration | After Reverse Bias Test at High-Temperature and High-Humidity | Total Estimation |
|---|---|---|---|---|---|---|---|---|---|---|---|---|
| SC Example 2-1 | 20 | * | 38 | 0.02 | 130 | 135 | $10^{-4}$ | 1.00 | 1.00 | 1.00 | 1.00 | ⊚ |
| SC Compar. Ex. 2-1 | 20 | * | 39 | 0.53 | 127 | 133 | $10^{-4}$ | 0.80 | 0.91 | 0.87 | 2.00 | x |
| SC Compar. Ex. 2-2 | 20 | * | 40 | -1.3 | 133 | 138 | $10^{-4}$ | 0.90 | 0.99 | 0.50 | 9.00 | x |

*Normal distribution around 0°
⊚: Excellent
x: Bad

EXAMPLE 3

On a supporting substrate 101 (SUS 304), a 1 μm thick transparent conductive layer 102 having a conductivity of $10^{-4}$ (1/Ωcm), made of a tin oxide film, was formed under various conditions by the magnetron sputtering process in accordance with a forming method similar to that of Example 1.

An estimate was made with the standard deviation of inclinations of 30°±2°. The average of angles in local valleys of the surface was evaluated. The result is shown in Table 5.

In the same manner as in Example 1, solar cells of pin amorphous silicon semiconductor were produced by stacking the semiconductor layers. At that time, the deposition speed of the i-type semiconductor layer 104 was increased to 20 Å/s. The estimated result is shown in Table 5.

TABLE 5

| Sample No. | Sampling Length (nm) | Distribution of Inclinations | Standard Deviation of Inclinations | Kurtosis of Distribution of Inclinations | Average of Angles in Local Valleys | Average of Angles in Local Mountains | Conductivity (1/Ωcm) | Yield | Initial Conversion Efficiency | After Optical Deterioration | After Vibrational Deterioration | After Reverse Bias Test at High-Temperature and High-Humidity | Total Estimation |
|---|---|---|---|---|---|---|---|---|---|---|---|---|---|
| SC Example 3-1 | 20 | * | 31 | -1.0 | 159 | 140 | $10^{-4}$ | 95 | 1.00 | 1.00 | 1.00 | 1.00 | ⊚ |
| SC Example 3-2 | 20 | * | 30 | -0.5 | 150 | 143 | $10^{-4}$ | 95 | 1.02 | 0.99 | 1.06 | 0.99 | ⊚ |
| SC Example 3-3 | 20 | * | 29 | 0 | 111 | 139 | $10^{-4}$ | 95 | 1.03 | 0.99 | 1.02 | 1.03 | ⊚ |
| SC Compar. Ex. 3-1 | 20 | * | 28.5 | 0.4 | 90 | 141 | $10^{-4}$ | 80 | 0.80 | 0.86 | 0.89 | 5.60 | x |
| SC Compar. Ex. 3-2 | 20 | * | 32 | 0.3 | 80 | 142 | $10^{-4}$ | 70 | 0.60 | 0.87 | 0.49 | 7.23 | x |

*Normal distribution around 0°
⊚: Excellent
x: Bad

EXAMPLE 4

Except that the transparent conductive layer 102 was made of an indium oxide film and the standard deviation of inclinations was 30°±2°, solar cells were produced in the same manner as in Example 3. The result is shown in Table 6.

TABLE 6

| Sample No. | Sampling Length (nm) | Distribution of Inclinations | Standard Deviation of Inclinations | Kurtosis of Distribution of Inclinations | Average of Angles in Local Valleys | Average of Angles in Local Mountains | Conductivity (1/Ωcm) | Initial Conversion Efficiency | After Optical Deterioration | After Vibrational Deterioration | After Reverse Bias Test at High-Temperature and High-Humidity | Total Estimation |
|---|---|---|---|---|---|---|---|---|---|---|---|---|
| SC Example 4-1 | 20 | * | 31 | −0.5 | 140 | 140 | $10^{-4}$ | 1.00 | 1.00 | 1.00 | 1.00 | ⊚ |
| SC Compar. Ex. 4-1 | 20 | * | 30 | 0.2 | 139 | 97 | $10^{-4}$ | 0.90 | 0.89 | 0.85 | 6.31 | x |
| SC Compar. Ex. 4-2 | 20 | * | 32 | 0.4 | 141 | 91 | $10^{-4}$ | 0.75 | 0.87 | 0.69 | 8.93 | x |

*Normal distribution around 0°
⊚: Excellent
x: Bad

EXAMPLE 5

On a supporting substrate 101 (SUS 304), a 1 μm thick zinc oxide film as the transparent conductive layer 102 was formed under various conditions by the magnetron sputtering process in accordance with a forming method similar to that of Example 1. In formation of the zinc oxide film, aluminum oxide was embedded onto a target and simultaneously sputtering was carried out. With increasing addition of aluminum oxide to the zinc oxide film, the conductivity increased.

Also, in the same manner as in Example 1, solar cells of pin amorphous silicon semiconductor were produced by stacking the semiconductor layers. At this time, an i-type semiconductor layer was deposited in a depositing chamber in which film deposition had been long made without cleaning of the depositing chamber.

The surface shape was measured at a sampling length of 20 nm. All specimens showed a normal distribution around 0°, all inclinations were 35°±2°, the peakedness was 0.21±0.03 and the average of angles in local valleys and local mountains were 145°±2° and 140°±2°, respectively, so that no distinct change accompanying the addition of aluminum oxide was detected.

Figure 9:
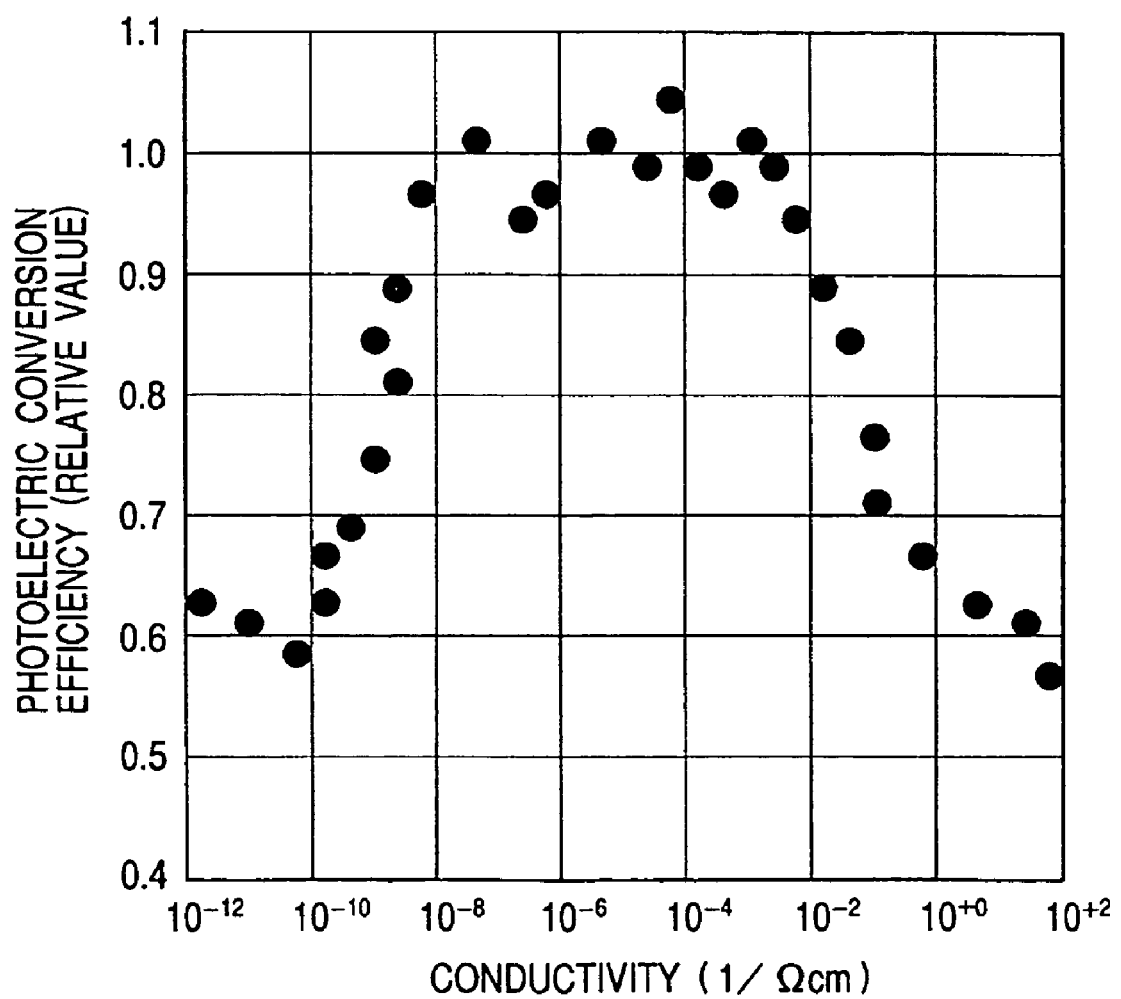
FIG. 9 is a graph showing the relationship between the conductivity of a transparent conductive layer and the photoelectric conversion efficiency.

Photovoltaic elements were manufactured using films different in conductivity to measure the efficiency of photoelectric conversion. The measured result is shown in FIG. 9. As shown in FIG. 9, a series resistance that is to large will not lead to the lowering of photoelectric conversion efficiency when the conductivity is $10^{-8}$ (1/Ωcm) or more, and a lower shunt resistance will not lead to the lowering of yield when the conductivity is $10^{-2}$ (1/Ωcm) or less.

On SEM observation of the surface of these specimens, many pin holes were observed in all of them.

EXAMPLE 6

On a supporting substrate 101 (SUS 304), a 1 μm thick zinc oxide film as the transparent conductive layer 102 was formed under various conditions by the magnetron sputtering process in accordance with a forming method similar to that of Example 1. In formation of the zinc oxide film, copper was embedded onto a target as an impurity for increasing the corrosion resistance of the transparent conductive layer and simultaneously sputtering was carried out. Although an attempt was made to change the amount of adding copper to the zinc oxide film, the conductivity hardly changed. These specimens were dipped in an aqueous solution of 30% iron chloride for 5 minutes. The aqueous solution of iron chloride is an etchant used for the patterning of ITO. No change was observed in specimens prepared on a target with copper embedded therein. Between the specimens prepared on a target with copper embedded therein and those prepared without embedding of copper, there was no significant difference in surface shape.

Also, after pin amorphous silicon semiconductor layers were stacked as the semiconductor layers in the same manner as in Example 1, these specimens were dipped in an aqueous solution of 30% iron chloride for 1 minute for the patterning of ITO. Measuring the photoelectric conversion efficiency revealed a decrease in conversion efficiency at a rate of 0.73 for specimens prepared without embedding of copper but no decrease in conversion efficiency for those prepared on a target with copper embedded therein.

EXAMPLE 7

On a supporting substrate 101 (SUS 304), a 50 nm thick aluminum film as the metal layer 108 was formed under various conditions by the magnetron sputtering method, as mentioned above, as a method for forming the metal layer 108. The surface shape of the metal layer was measured at a sampling length of 20 nm. The obtained result is shown in Table 7.

Thereafter, a zinc oxide film was formed as the transparent electrode 102 by the DC magnetron sputtering process. The thickness and the conductivity were set to 1 μm and $10^{-4}$ (1/Ωcm), respectively.

Also, in the same manner as in Example 1, solar cells of pin amorphous silicon semiconductor were produced by stacking the semiconductor layers, and an estimate was made. The estimated result is shown in Table 7.

TABLE 7

| Sample No. | Surface Shape of the Metal Layer | | | | Surface Shape of the Transparent Conductive Layer | | | |
|---|---|---|---|---|---|---|---|---|
| | Sampling Length (nm) | Distribution of Inclinations | Standard Deviation of Inclinations | Kurtosis of Distribution of Inclinations | Sampling Length (nm) | Distribution of Inclinations | Standard Deviation of Inclinations | Kortosis of Distribution of Inclinations |
| SC Example 7-1 | 20 | * | 5 | 0.3 | 20 | * | 139 | 0.21 |
| SC Example 7-2 | 20 | * | 10 | 0.02 | 20 | * | 138 | 0.22 |
| SC Example 7-3 | 20 | * | 20 | −0.4 | 20 | * | 140 | 0.21 |
| SC Compar. Ex. 7-1 | 20 | * | 2 | 0.4 | 20 | * | 140 | 0.20 |
| SC Compar. Ex. 7-2 | 20 | * | 30 | −0.9 | 20 | * | 139 | 0.21 |

| Sample No. | Surface Shape of the Transparent Conductive Layer | | Conductivity (1/Ωcm) | Initial Conversion Efficiency | After Optical Deterioration | After Vibrational Deterioration | After Reverse Bias Test at High-Temperature and High-Humidity | Total Estimation |
|---|---|---|---|---|---|---|---|---|
| | Average of Angles in Local Valleys | Average of Angles in Local Mountains | | | | | | |
| SC Example 7-1 | 135 | 129 | $10^{-4}$ | 1.00 | 1.00 | 1.00 | 1.00 | ◉ |
| SC Example 7-2 | 132 | 130 | $10^{-4}$ | 1.11 | 0.99 | 1.02 | 1.02 | ◉ |
| SC Example 7-3 | 133 | 131 | $10^{-4}$ | 1.05 | 0.98 | 1.05 | 0.97 | ◉ |
| SC Compar. Ex. 7-1 | 134 | 130 | $10^{-4}$ | 0.99 | 0.87 | 0.87 | 5.00 | x |
| SC Compar. Ex. 7-2 | 133 | 131 | $10^{-4}$ | 0.60 | 0.99 | 0.80 | 8.00 | x |

*Normal distribution around 0°
◉: Excellent
x: Bad

As described above, a photovoltaic element according to the present invention can increase the short-circuit current, and the photovoltaic element can be improved while keeping the open voltage and the fill factor. Besides, it can be improved in the optical and vibrational deterioration of photovoltaic element and moreover in the durability even under application of a reverse bias in environments of high temperature and high humidity.

What is claimed is:

1. A substrate with a transparent conductive layer, comprising at least one transparent conductive layer stacked on a supporting substrate, wherein a surface of said transparent conductive layer has a distribution of inclination arctan (df/dx) in a range of a sampling length dx of 20 nm to 100 nm when a distance of a surface of said transparent conductive layer from a supporting substrate face is regarded as f being a normal distribution having a kurtosis of −1.2 to 0.5 around 0° and a standard deviation thereof being 20° to 55°.

2. A substrate with a transparent conductive layer according to claim 1, wherein an average value in distribution of angles made by local valleys in said range is 170° to 110°.

3. A substrate with a transparent conductive layer according to claim 1, wherein an average value in distribution of angles made by local mountains in said range is 170° to 100°.

4. A substrate with a transparent conductive layer according to claim 1, wherein said transparent conductive layer contains at least one selected from oxide, nitride and sulfide of aluminum, zinc, tin, indium, titanium and tantalum, and a complex compound thereof.

5. A substrate with a transparent conductive layer according to claim 1, wherein a conductivity of said transparent conductive layer is $10^{-8}$ (1/Ωcm) to $10^{-2}$ (1/Ωcm).

6. A substrate with a transparent conductive layer according to claim 1, wherein said transparent conductive layer contains a corrosion resistance improving material.

7. A substrate with a transparent conductive layer according to claim 1, wherein a metal layer is provided between said supporting substrate and said transparent conductive layer.

8. A substrate with a transparent conductive layer according to claim 7, wherein a surface of said metal layer in contact with said transparent conductive layer has a distribution of inclination arctan (dfm/dx) in a range of a sampling length dx of 20 nm to 100 nm when a distance of said surface of said metal layer in contact with said transparent conductive layer from a supporting substrate face is regarded as fm being a normal distribution having a kurtosis of −1.0 to 0.5 around 0° and a standard deviation thereof being 5° to 20°.

9. A substrate with a transparent conductive layer according to claim 7, wherein said metal layer contains at least one selected from gold, silver, copper, aluminum and magnesium, and an alloy thereof.

10. A photovoltaic element comprising a semiconductor layer having at least one layer stacked on a substrate with a transparent conductive layer of any one of claims 1 to 9.

11. A photovoltaic element according to claim 10, wherein said semiconductor layer comprises a non-single-crystalline silicon based semiconductor.

12. A photovoltaic element according to claim 11, wherein said non-single-crystalline silicon based semiconductor contains a microcrystalline phase.

* * * * *